US008680854B2

(12) United States Patent
Dyer et al.

(10) Patent No.: US 8,680,854 B2
(45) Date of Patent: Mar. 25, 2014

(54) SEMICONDUCTOR GMI MAGNETOMETER

(75) Inventors: Terry Dyer, Largs (GB); Anuraag Mohan, Fremont, CA (US); Peter J. Hopper, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 332 days.

(21) Appl. No.: 13/309,443

(22) Filed: Dec. 1, 2011

(65) Prior Publication Data
US 2013/0141089 A1 Jun. 6, 2013

(51) Int. Cl.
*G01R 33/09* (2006.01)
*G01R 33/06* (2006.01)
*G01R 33/00* (2006.01)

(52) U.S. Cl.
CPC .......... *G01R 33/063* (2013.01); *G01R 33/0052* (2013.01)
USPC .......................................... 324/249; 324/252

(58) Field of Classification Search
CPC . G01R 33/063; G01R 33/0052; G01R 33/093
USPC .................................................. 324/249, 252
See application file for complete search history.

(56) References Cited

U.S. PATENT DOCUMENTS

| | | | |
|---|---|---|---|
| 6,650,112 B2 * | 11/2003 | Takayama et al. ............ 324/249 |
| 7,842,544 B2 | 11/2010 | Smeys et al. | |
| 7,843,056 B2 | 11/2010 | Smeys et al. | |
| 7,898,068 B2 | 3/2011 | Smeys et al. | |
| 7,901,981 B2 | 3/2011 | Smeys et al. | |
| 7,901,984 B2 | 3/2011 | Smeys et al. | |
| 7,902,661 B2 | 3/2011 | Smeys et al. | |
| 7,936,246 B2 | 5/2011 | Hopper et al. | |
| 8,610,427 B2 * | 12/2013 | Honkura et al. ............ 324/244 |
| 2013/0038323 A1 * | 2/2013 | Honkura et al. ............ 324/244 |
| 2013/0181705 A1 * | 7/2013 | Honkura et al. ............ 324/252 |

OTHER PUBLICATIONS

Zhou, Zhimin et al., "The investigation of giant magnetoimpedance effect in meander NiFe/Cu/NiFe film", Journal of Magnetism and Magnetic Materials, 320, 2008, pp. e967-e970.
Chen, L. et al., "Giant magnetoimpedance effect in sputtered single layered NiFe film and meander NiFe/Cu/NiFe film", Journal of Magnetism and Magnetic Materials, 322, 2010, pp. 2834-2839.
Morikawa, Takeshi et al., "Enhancement of Giant Magneto-Impedance in Layered Film by Insulator Separation", IEEE Transactions on Magnetics, vol. 32, No. 5, 1996, pp. 4965-4967.
Phan, Manh-Huong et al., "Giant magnetoimpedance materials: Fundamentals and applications", Progress in Materials Science, 53, 2008, pp. 323-420.
Honkura, Yoshinobu, "Development of G2 Motion Control Sensor Using MI Sensor in Mobile Phones", Spanish Club of Magnetism Oviedo, 2005, pp. 1-47.

(Continued)

*Primary Examiner* — Jay Patidar
(74) *Attorney, Agent, or Firm* — Eugene C. Conser; Wade J. Brady, III; Frederick J. Telecky, Jr.

(57) ABSTRACT

A giant magneto-impedance (GMI) magnetometer is formed in a semiconductor wafer fabrication sequence, which significantly reduces the size and cost of the GMI magnetometer. The semiconductor wafer fabrication sequence forms a magnetic conductor, a non-magnetic conductor that is wrapped around the magnetic conductor as a coil, and non-magnetic conductors that touch the opposite ends of the magnetic conductor.

18 Claims, 48 Drawing Sheets

(56) References Cited

OTHER PUBLICATIONS

Vazquez, Manuel, "Giant Magneto-Impedance Applications", Institute for Materials Science, CSIC,, [online], [retrieved on Nov. 11, 2011], Retrieved from the Internet <URL http://esm.neel.cnrs.fr/2007-cluj/abs/Vazquez-abs.pdf>.

Panina L.V. et al., "Magneto-impedance effect in amorphous wires", Applied Physics Letters, vol. 65, Issue 9, 1994, pp. 1189-1191.

Product Lineup, "G2 Motion Sensor AMI 602", Aichi Steel Corporation, [online], [retrieved on Nov. 11, 2011], Retrieved from the Internet <URL http://www.aichi-mi.com/3_products/catalog%20e.pdf>.

U.S. Appl. No. 13/218,772, filed Aug. 26, 2011 for Anuraag Mohan et al.

U.S. Appl. No. 13/013,563, filed Jan. 25, 2011 to Peter Smeys et al.

U.S. Appl. No. 13/218,682, filed Aug. 26, 2011 to Ann Gabrys et al.

* cited by examiner

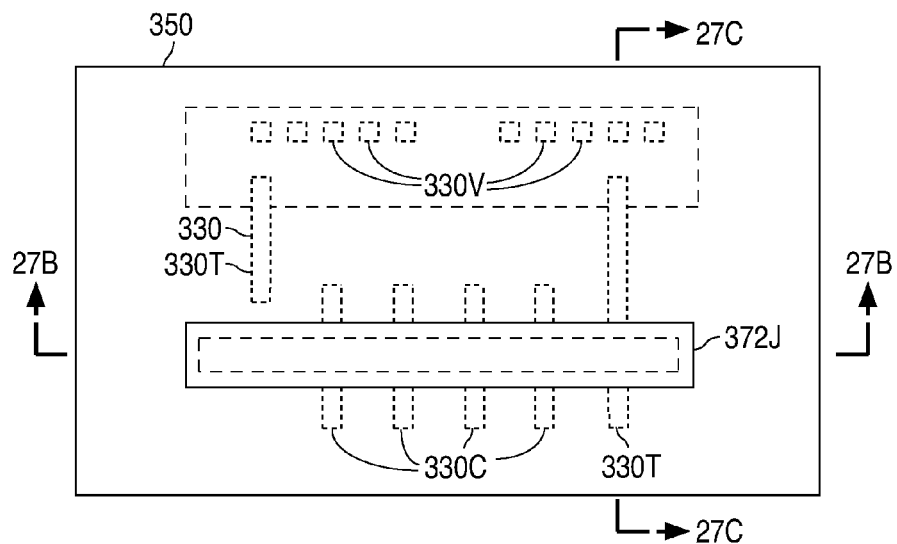
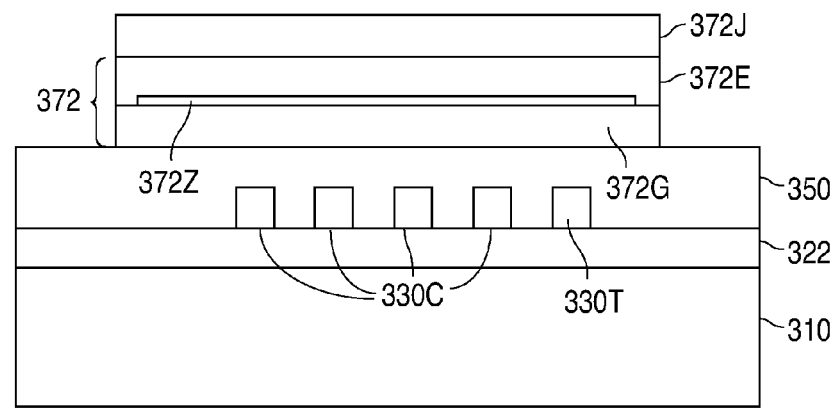
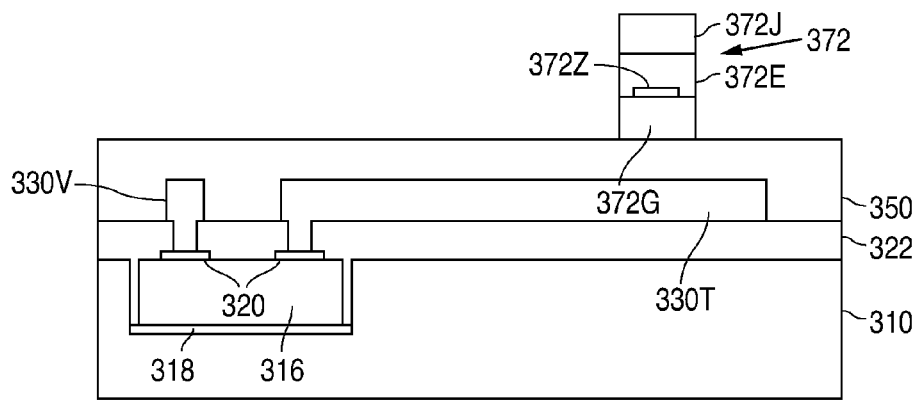

SEMICONDUCTOR GMI MAGNETOMETER

BACKGROUND OF THE INVENTION

1. Field of the Invention

The present invention relates to magnetometers and, more particularly, to a semiconductor giant magneto-impedance (GMI) magnetometer.

2. Description of the Related Art

A magnetometer is a device that measures the strength of an external magnetic field. There are a number of different approaches to measuring magnetic fields, and various different types of magnetometers have been developed based on these different approaches. One type of magnetometer is based on the giant magneto-impedance (GMI) effect.

The GMI effect results when a high-frequency alternating current passes through a soft ferromagnetic material. In the absence of an external magnetic field, the soft ferromagnetic material has a baseline impedance. However, in the presence of an external magnetic field, the impedance of the soft ferromagnetic material changes significantly. This change in the impedance in response to an external magnetic field is known as the GMI effect.

FIG. 1 shows a diagram that illustrates an example of a prior art GMI magnetometer 100. As shown in FIG. 1, GMI magnetometer 100 includes a soft ferromagnetic structure 110, and an alternating current source 112 that is connected to soft ferromagnetic structure 110. GMI magnetometer 100 also includes a sense coil 114 that is wrapped around soft ferromagnetic structure 110, and a processing circuit 116 that is connected to sense coil 114.

In operation, alternating current source 112 drives a high-frequency alternating current through soft ferromagnetic structure 110, which generates an alternating voltage across soft ferromagnetic structure 110. In the absence of an external magnetic field, soft ferromagnetic structure 110 has a base line impedance. In the presence of an external magnetic field, the impedance of soft ferromagnetic structure 110 changes. Materials which have a higher circumferential or transverse permeability provide a greater change in the impedance.

The alternating current passing through soft ferromagnetic structure 110 generates an alternating magnetic field, which changes in response to changes in the impedance of soft ferromagnetic structure 110. The alternating magnetic field induces an alternating current and an alternating voltage in sense coil 114 that tracks the alternating current passing through soft ferromagnetic structure 110 and the alternating voltage across soft ferromagnetic structure 110.

Processing circuit 116 detects phase changes between the alternating current and alternating voltage in sense coil 114, and determines changes in impedance from the changes in phase. Processing circuit 116 then determines changes in the magnitude of an external magnetic field from the changes in impedance, and generates an output voltage that is proportional to the magnitude of the external magnetic field.

Alternatively, in an H-field detection scheme, sense coil 114 is omitted, and processing circuit 116 is electrically connected to the opposite ends of ferromagnetic structure 110. In this case, processing circuit 116 measures the induced change in ac impedance directly across ferromagnetic structure 110.

For example, Aichi Steel manufactures products (e.g., compass 360 701 and motion sensor A603 0601) that utilize a GMI magnetometer where soft ferromagnetic structure 110 is implemented with an amorphous wire of FeCoSiB, which is cold drawn to a radius of approximately 15-30 μm and then tension annealed to obtain precise circumferential anisotropy.

Sense coil 114, in turn, is implemented with a wire that is insulated from and wrapped around the amorphous wire to form a GMI sensor. The GMI sensor is attached to a printed circuit board, with the amorphous wire of the GMI sensor being connected to an alternating current source, and the wrapped wire that forms sense coil 114 of the GMI sensor being electrically connected by way of printed circuit board traces to integrated circuits that include processing circuit 116.

Although GMI magnetometers measure the strength of an external magnetic field, current-generation GMI magnetometers tend to be bulky and expensive to manufacture. Thus, there is a need for a smaller and less expensive GMI magnetometer.

BRIEF DESCRIPTION OF THE DRAWINGS

FIG. 2A is a plan view. FIG. 2B is a cross-sectional view taken along line 2B-2B in FIG. 2A. FIG. 2C is a cross-sectional view taken along line 2C-2C in FIG. 2A.

FIGS. 3A-43A are a series of plan views. FIGS. 3B-43B are a series of cross-sectional views taken along lines 3B-43B, respectively, in FIGS. 3A-43A. FIGS. 3C-43C are a series of cross-sectional views taken along lines 3C-43C, respectively, in FIGS. 3A-43A.

FIG. 44A is a plan view. FIG. 44B is a cross-sectional view taken along line 44B-44B in FIG. 44A. FIG. 44C is a cross-sectional view taken along line 44C-44C in FIG. 44A.

DETAILED DESCRIPTION OF THE INVENTION

Figure 1:
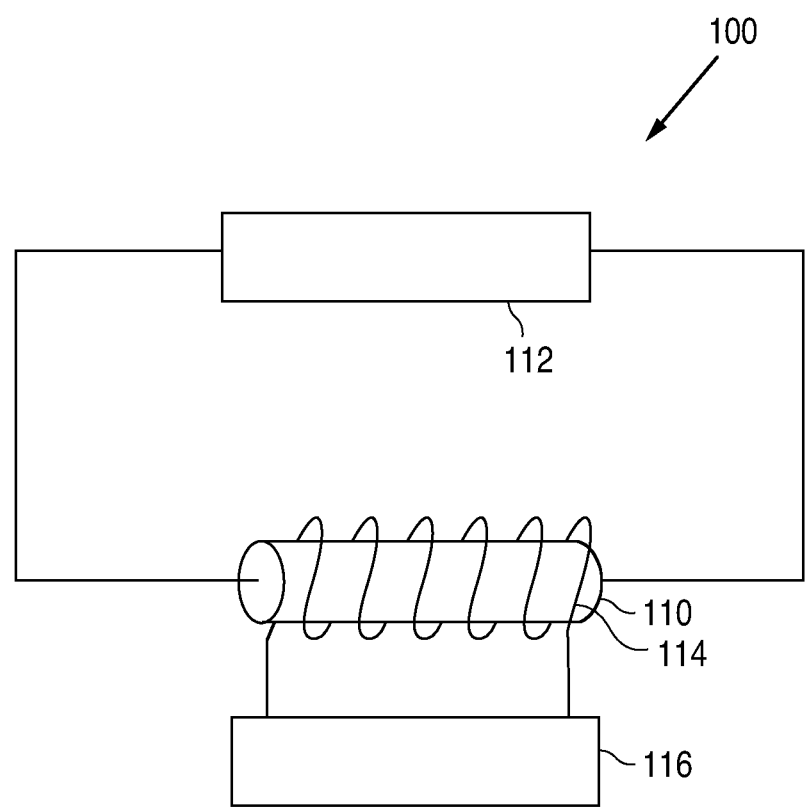
FIG. 1 is a block diagram illustrating an example of a prior art GMI magnetometer 100.
Figure 2A:
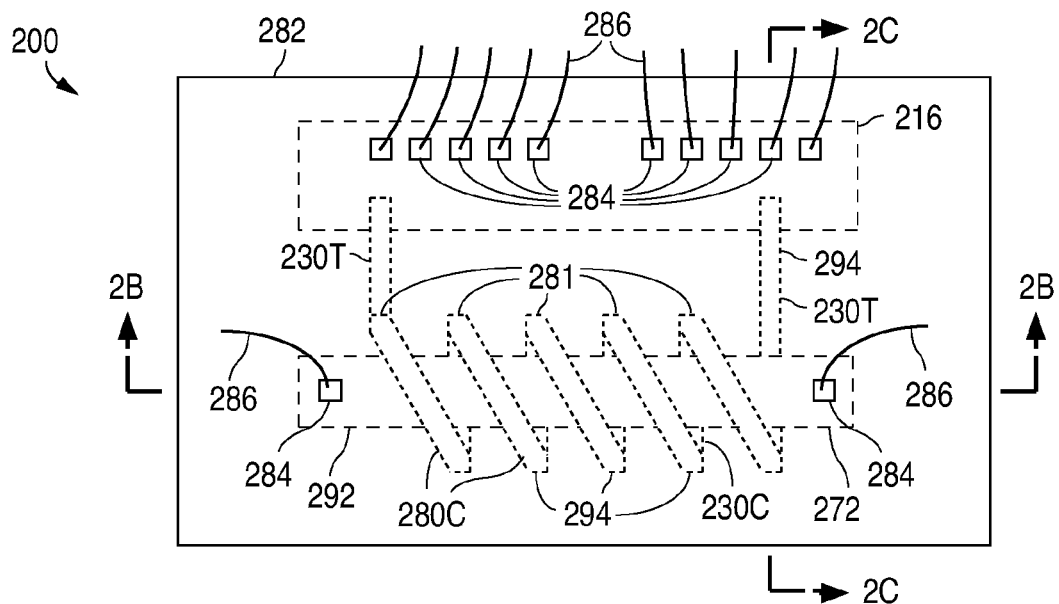
FIGS. 2A-2C are views illustrating an example of a semiconductor giant magneto-impedance (GMI) magnetometer 200 in accordance with the present invention.
Figure 2B:
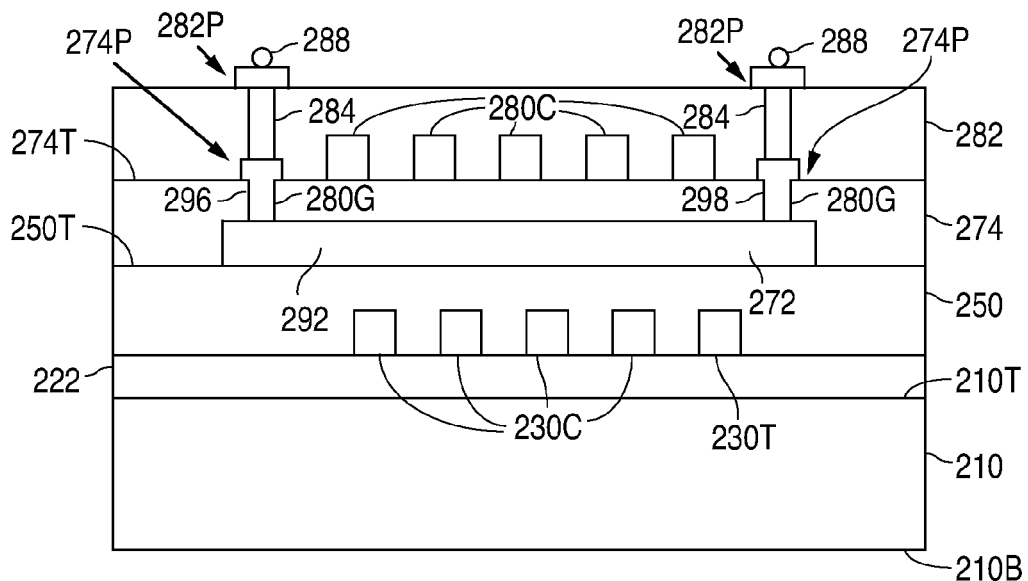
Figure 2C:
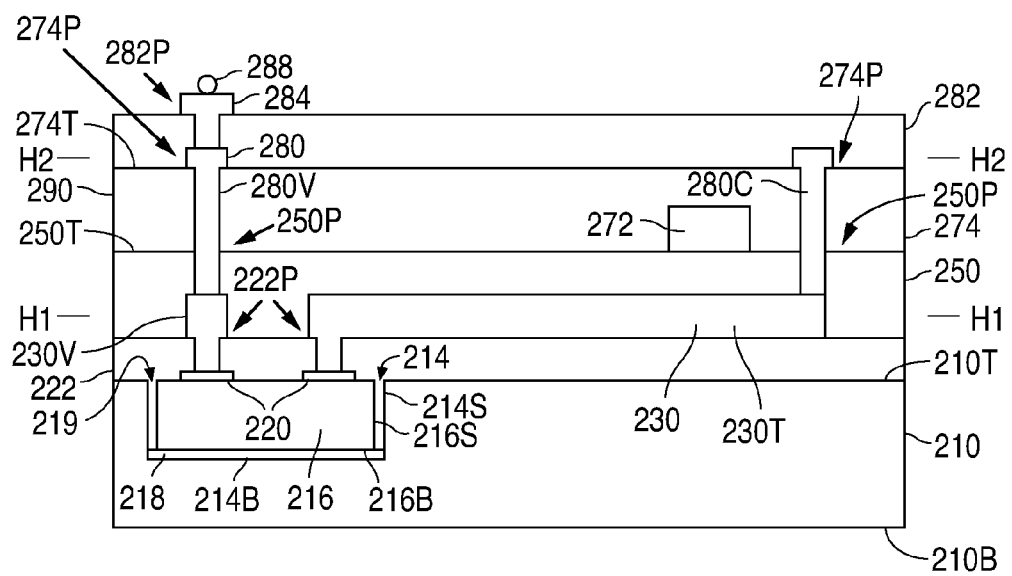

FIGS. 2A-2C show views that illustrate an example of a semiconductor giant magneto-impedance (GMI) magnetometer 200 in accordance with the present invention. FIG. 2A shows a plan view, while FIG. 2B shows a cross-sectional view taken along line 2B-2B in FIG. 2A, and FIG. 2C shows a cross-sectional view taken along line 2C-2C in FIG. 2A. As described in greater detail below, the present invention provides a semiconductor-based GMI magnetometer.

As shown in FIGS. 2A-2C, semiconductor GMI magnetometer 200 includes a semiconductor structure 210 that has a bottom surface 210B, a top surface 210T, and a cavity 214 that extends from the top surface 210T down into semiconductor structure 210. Cavity 214, in turn, has a side wall surface 214S and a bottom surface 214B that lies above and vertically spaced apart from the bottom surface 210B of semiconductor structure 210. In addition, bottom surface 214B can be either conductive or non-conductive.

As further shown in FIGS. 2A-2C, semiconductor GMI magnetometer 200 includes a die 216 that lies in cavity 214, and an adhesive 218 that attaches die 216 to the bottom surface 214B of cavity 214. Die 216 has a side wall surface 216S, a bottom surface 216B that touches adhesive 218, and a number of conductive pads 220 that provide external electrical connection points for die 216. Further, a side wall space 219 lies between the side wall surface 214S of cavity 214 and the side wall surface 216S of die 216.

In addition, die 216 includes a processing circuit. In the present example, the processing circuit is conventionally implemented, and includes all of the electrical components that are required to detect phase changes between an alternating current and an alternating voltage, determine impedance changes from the phase changes, determine changes in the magnitude of an external magnetic field from the impedance changes, and generate an output voltage that is proportional to the magnitude of the external magnetic field in response to changes in the impedance.

Adhesive 218, in turn, can be implemented with, for example, a conductive or non-conductive epoxy or die attach film. In addition, adhesive 218, which can be, for example, 25 μm thick, can be selected based on any isolation and thermal requirements of die 216 and whether the bottom surface 214B of cavity 214 is conductive or non-conductive.

Semiconductor GMI magnetometer 200 also includes a non-conductive structure 222 that touches die 216 and semiconductor structure 210. Non-conductive structure 222, which fills up the remainder of cavity 214, has a number of openings 222P that expose the conductive pads 220 of die 216.

Further, semiconductor GMI magnetometer 200 includes a number of metal lower structures 230 that touch non-conductive structure 222. The metal lower structures 230 include via structures 230V that extend through non-conductive structure 222 to touch a first group of the conductive pads 220 which represent power and input/output signal pads, via trace structures 230T with via sections that extend through non-conductive structure 222 to touch a second group of the conductive pads 220 which represent input/output coil pads, and lower coil structures 230C that form the bottom sections of a to-be-formed coil.

In addition, semiconductor GMI magnetometer 200 includes a non-conductive structure 250 that touches non-conductive structure 222, the via structures 230V, the via trace structures 230T, and the lower coil structures 230C. Non-conductive structure 250 has a substantially planar top surface 250T, and a number of openings 250P that expose the via structures 230V, one end of each via trace 230T, and the opposite ends of each lower coil structure 230C.

GMI magnetometer 200 additionally includes a magnetic structure 272 that touches the top surface 250T of non-conductive structure 250. In the present example, magnetic structure 272 has a high permeability, low resistivity, and a thin-film rectangular shape with a first end region and an opposing second end region that is laterally spaced apart from the first end region. Magnetic structure 272 is also circumferentially or transversely anisotropic. Magnetic structure 272 can be implemented with a soft magnetic ferromagnetic material, such as an alloy of nickel and iron, or a sandwich structure of a first material, such as an alloy of nickel and iron, surrounding a second material, such as a region of silicon dioxide or copper.

Further, semiconductor GMI magnetometer 200 includes a non-conductive structure 274 that touches non-conductive structure 250 and magnetic structure 272. Non-conductive structure 274 has a number of openings 274P that expose the openings 250P which, in turn, expose the via structures 230V, one end of each via trace 230T, and the opposite ends of each lower coil structure 230C. The openings 274P also expose the ends of magnetic structure 272.

In addition, semiconductor GMI magnetometer 200 includes a number of metal upper structures 280 that touch non-conductive structure 274. The metal upper structures 280 include via structures 280V that touch the via structures 230V, and via structures 280G that touch the opposing end regions of magnetic structure 272.

The metal upper structures 280 also include upper coil structures 280C that touch the lower coil structures 230C and the ends of the via trace structures 230T. The electrical connection of the upper coil structures 280C to the lower coil structures 230C forms a sense coil 281. Sense coil 281, in turn, is wrapped around magnetic structure 272 to form a GMI sensor.

Semiconductor GMI magnetometer 200 also includes a non-conductive structure 282 that touches the top surface 274T of non-conductive structure 274 and the metal upper structures 280. As further shown in FIGS. 2A-2C, non-conductive structure 282 is formed to have a number of pad openings 282P that expose portions of the via structures 280V and the via structures 280G.

Further, semiconductor GMI magnetometer 200 includes a number of bond pads 284, such as aluminum pads, that lie in the pad openings 282P to touch the via structures 280V and the via structures 280G. The bond pads 284 can be connected by way of bonding wires 286 to external connection structures (e.g., pins or pads) on a lead frame as illustrated in FIG. 2A, or by way of solder balls 288 to a printed circuit board as illustrated in FIG. 2C.

Thus, semiconductor GMI magnetometer 200 includes a non-conductive structure 290 that touches die 216 and the top surface 210T of semiconductor structure 210. In the present example, non-conductive structure 290 is implemented with non-conductive structure 222, non-conductive structure 250, non-conductive structure 274, and non-conductive structure 282.

In addition, GMI magnetometer 200 includes a magnetic conductor 292 (an electrical conductor with impedance when conducting an alternating current, or that is attracted by a magnet when not conducting a current) that touches non-conductive structure 290. In the present example, magnetic conductor 292 is implemented with magnetic structure 272. As a result, magnetic conductor 292 has transverse anisotropy.

GMI magnetometer 200 also includes a non-magnetic conductor 294 (an electrical conductor with only resistance or only a real component of impedance when conducting an alternating current, or that is not attracted by a magnet when not conducting a current) that touches non-conductive structure 290. In the present example, non-magnetic conductor 294 is implemented with the lower coil structures 230C and the upper coil structures 280C, which are connected together to form sense coil 281, along with a pair of via traces structures 230T that are electrically connected to die 216 and sense coil 281. Thus, non-magnetic conductor 294, which is electrically isolated from magnetic conductor 292 by non-conductive structure 290, is wound around magnetic conductor 292 in a spiral to form sense coil 281.

Further, the lower coil structures 230C of sense coil 281 touch non-conductive structure 290, and lie in a horizontal plane H1 that lies below and vertically spaced apart from the bottom surface of magnetic conductor 292. In addition, in the present example, the horizontal plane H1 lies above and vertically spaced apart from the top surface 210T of semiconductor structure 210. Further, the upper coil structures 280C of sense coil 281 touch non-conductive structure 290, and a portion of the upper coil structures 280C lie in a horizontal plane H2 that lies above and vertically spaced apart from the top surface of magnetic conductor 292.

GMI magnetometer 200 additionally includes non-magnetic conductors 296 and 298 (also electrical conductors with only resistance or only a real component of impedance when conducting an alternating current, or that is not attracted by a magnet when not conducting a current) that touch non-conductive structure 290. In the present example, non-magnetic conductors 296 and 298, which are connected to the ends of magnetic conductor 292, are implemented with the via structures 280G and the bond pads 284.

In operation, a high-frequency alternating current is passed through magnetic structure 272 by way of the via structures 280G and the bond pads 284, which generates an alternating voltage across magnetic structure 272. In the absence of an external magnetic field, magnetic structure 272 has a base line impedance. In the presence of an external magnetic field, the impedance of magnetic structure 272 changes.

The alternating current passing through magnetic structure 272 generates an alternating magnetic field, which changes in response to changes in the impedance of magnetic structure 272. The alternating magnetic field induces an alternating current and an alternating voltage in sense coil 281 that tracks the alternating current passing through magnetic structure 272 and the alternating voltage across magnetic structure 272.

The processing circuit in die 216 detects phase changes between the alternating current and alternating voltage in sense coil 281, and determines changes in impedance from the changes in phase. The processing circuit in die 216 then determines changes in the magnitude of an external magnetic field from the changes in impedance, and generates an output voltage that is proportional to the magnitude of the external magnetic field.

FIGS. 3A-3C through 43A-43C show a series of views that illustrate an example of a method of forming a semiconductor GMI magnetometer in accordance with the present invention. FIGS. 3A-43A show a series of plan views, while FIGS. 3B-43B show a series of cross-sectional views taken along lines 3B-43B, respectively, in FIGS. 3A-43A, and FIGS. 3C-43C show a series of cross-sectional views taken along lines 3C-43C, respectively, in FIGS. 3A-43A.

Figure 3A:
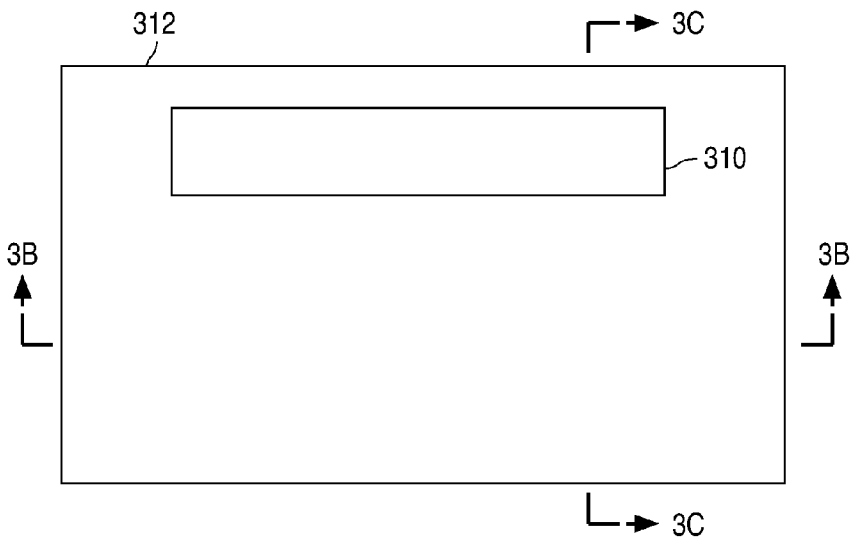
FIGS. 3A-3C through 43A-43C are a series of views illustrating an example of a method of forming a semiconductor GMI magnetometer in accordance with the present invention.
Figure 3B:
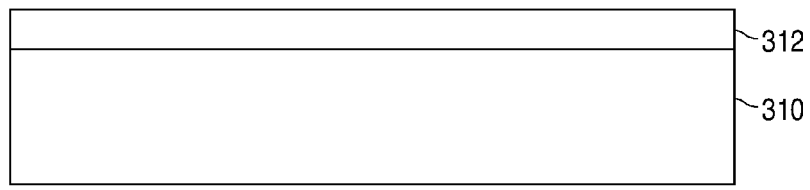
Figure 3C:
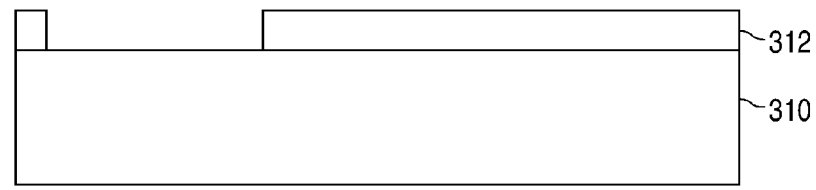

As shown in the FIGS. 3A-3C, the method of forming a semiconductor GMI magnetometer utilizes a conventionally-formed semiconductor wafer 310. Wafer 310, in turn, can be implemented with a conducting material, such as silicon, or a non-conducting material such as quartz or G10-FR4 glass epoxy laminates. As further shown in FIGS. 3A-3C, the method begins by forming a patterned photoresist layer 312 on the top surface of wafer 310.

Patterned photoresist layer 312 is formed in a conventional manner, which includes depositing a layer of photoresist, projecting a light through a patterned black/clear glass plate known as a mask to form a patterned image on the layer of photoresist that softens the photoresist regions exposed by the light, and removing the softened photoresist regions.

Figure 4A:
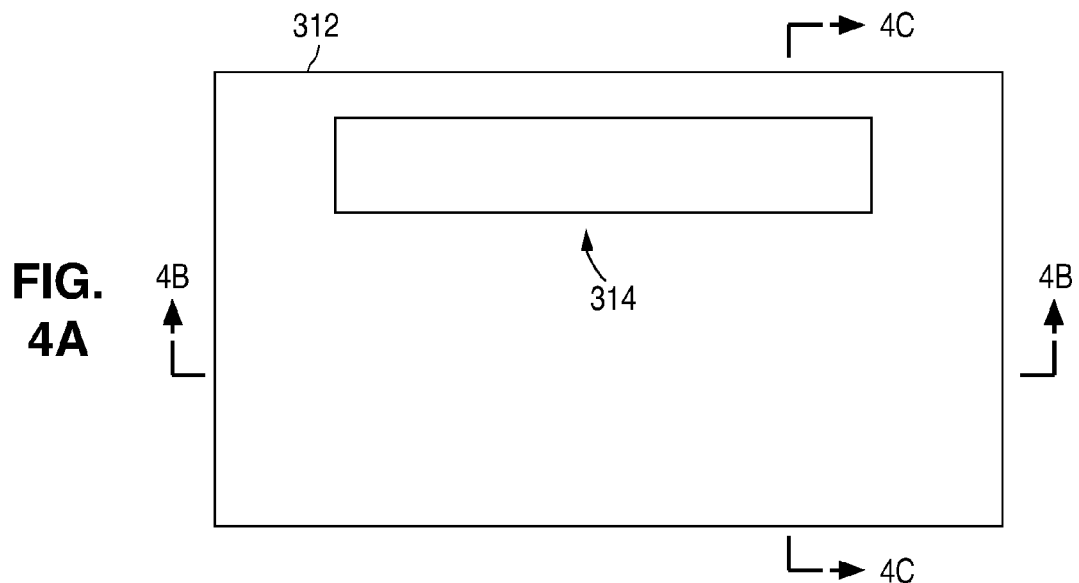
Figure 4B:
Figure 4C:
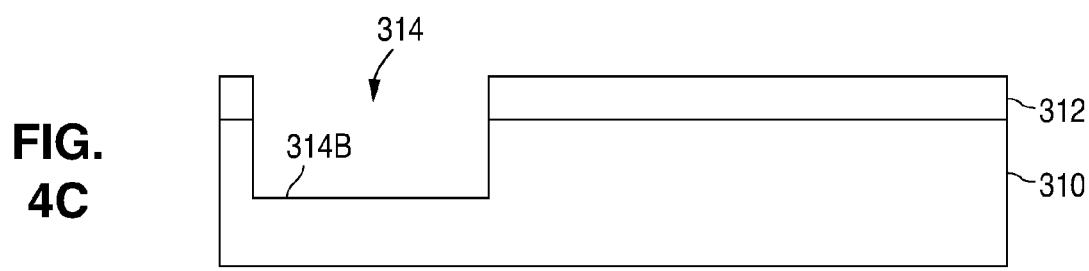

As shown in FIGS. 4A-4C, after patterned photoresist layer 312 has been formed, the exposed region of wafer 310 is etched in a conventional manner to form a number of cavities 314, which each has a bottom surface 314B, in wafer 310. (Only one cavity 314 is shown for simplicity.) Wafer 310 can be etched using a dry etch such as reactive ion etching, or a timed wet etch.

After the etch, the resulting structure is rinsed, and patterned photoresist layer 312 is then removed in a conventional manner, such as with acetone. Once patterned photoresist layer 312 has been removed, the resulting structure is conventionally cleaned to remove organics, such as with a Piranha etch (e.g., using a solution of 50 $H_2SO_4$:1 $H_2O_2$ @ 120° C. removes approximately 240 nm/minute). If wafer 310 is conductive, a conformal non-conducting material, such as oxide or nitride, can be optionally formed on wafer 310 to line cavity 314 so that the bottom surface 314B of cavity 314 is non-conductive.

Figure 5A:
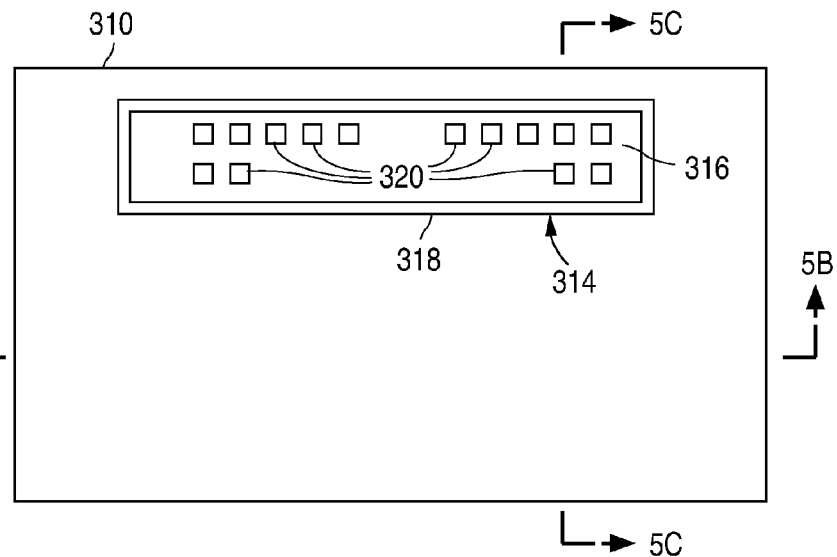
Figure 5B:
Figure 5C:
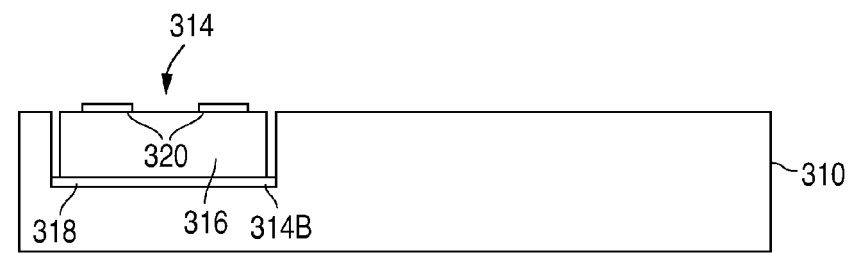

Next, as shown in FIGS. 5A-5C, a die 316 is placed in each cavity 314 and attached to the bottom surface 314B of the cavity 314 using an adhesive 318 such as, for example, a conductive or non-conductive epoxy or die attach film. Adhesive 318, which can be, for example, 25 μm thick, can be selected based on any isolation and thermal requirements of die 316 and whether the bottom surface 314B of cavity 314 is conductive or non-conductive. Die 316, which includes the processing electronics and a number of conductive pads 320, can be placed in and attached to the bottom surface 314B of cavity 314 using a conventional pick and place machine.

Figure 6A:
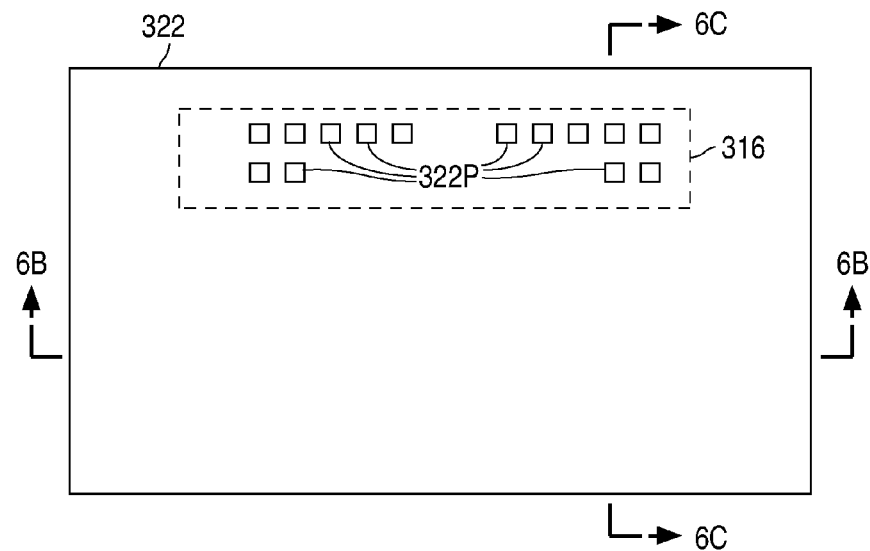
Figure 6B:
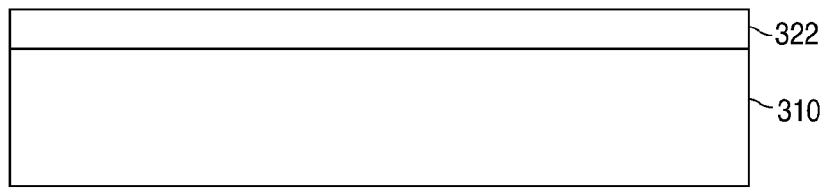
Figure 6C:
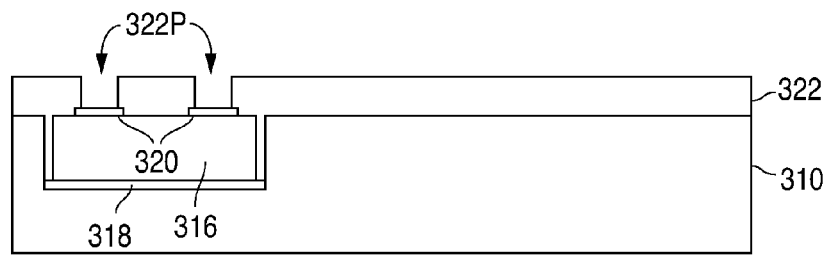

As shown in FIGS. 6A-6C, after a die 316 has been attached to the bottom surface 314B of each cavity 314, a non-conductive structure 322 is formed to touch each die 316 and wafer 310. Non-conductive structure 322, which fills up the remainder of each cavity 314, has a number of openings 322P that expose the conductive pads 320 on each die 316.

Figure 7A:
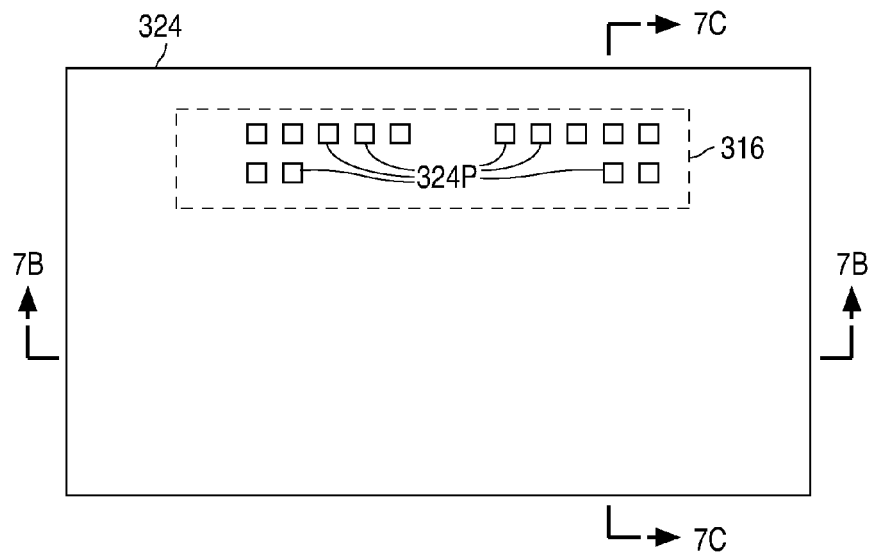
Figure 7B:
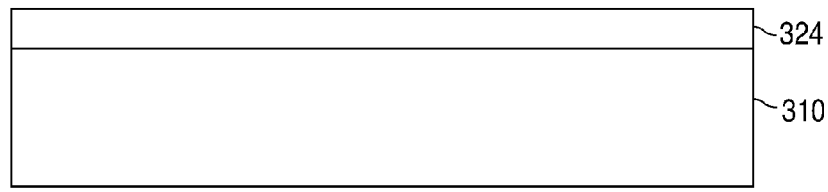
Figure 7C:
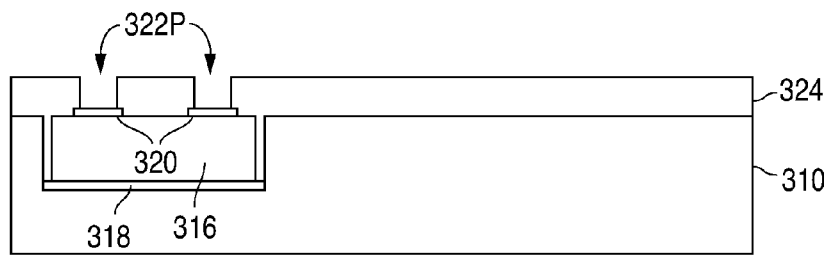

In the present example, as shown in FIGS. 7A-7C, non-conductive structure 322 is formed by depositing a layer of photoimageable epoxy or polymer 324, such as SU-8, benzocyclobutene (BCB), or polybenzoxazole (PBO), which are substantially self planarizing. Alternatively, a low temperature oxide can be deposited and then planarized such as with chemical mechanical polishing. Once the photoimageable epoxy or polymer has been deposited, the openings 322P are formed in photoimageable epoxy or polymer layer 324 by projecting a light through a mask to form a patterned image on layer 324 that softens the regions of layer 324 that are exposed by the light, and then removing the softened regions of layer 324.

Figure 8A:
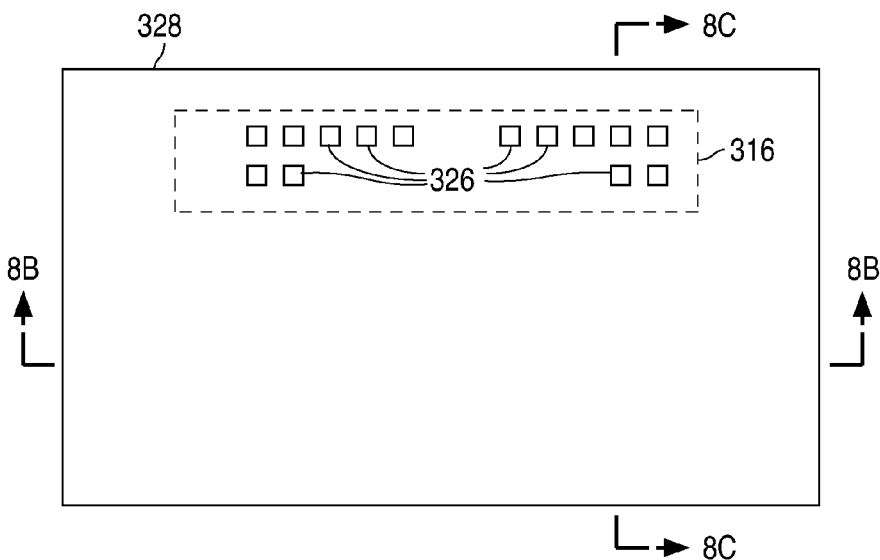
Figure 8B:
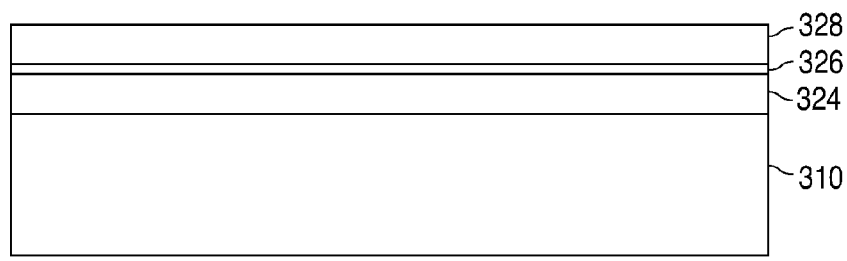
Figure 8C:
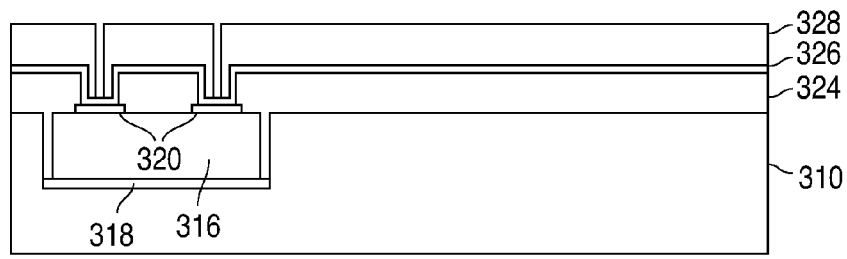

After the openings 322P have been formed, as shown in FIGS. 8A-8C, a layer of nitride 326 approximately 0.6 μm thick is conventionally formed on photoimageable epoxy or polymer layer 324 to line the openings 322P using, for example, plasma-enhanced chemical vapor deposition (PECVD).

Following this, a patterned photoresist layer 328 is conventionally formed on nitride layer 326. The exposed regions of nitride layer 326 are next etched to expose the conductive pads 320 on each die 316. Patterned photoresist layer 328 is then removed in a conventional manner, followed by a conventional cleaning (e.g., a Piranha etch) to complete the formation of non-conductive structure 322. (The formation and etch of nitride layer 326 are optional and can be omitted.)

Figure 9A:
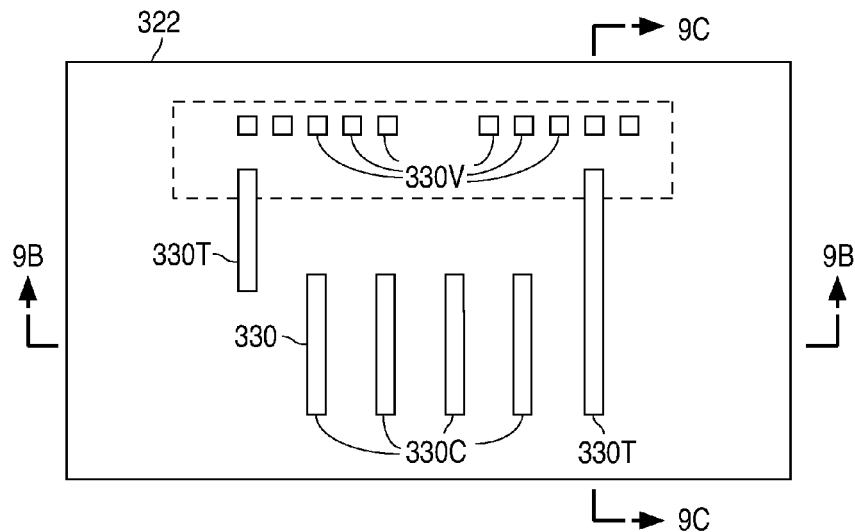
Figure 9B:
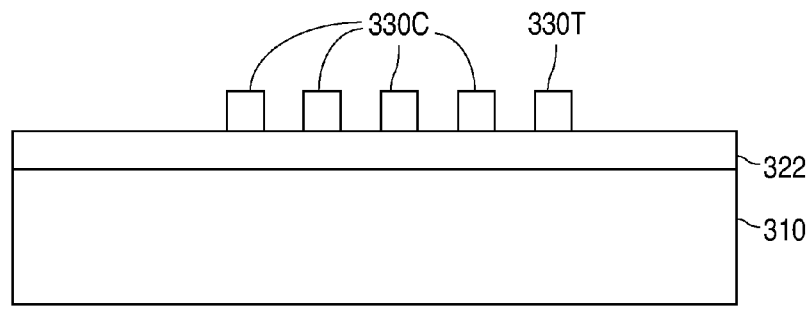
Figure 9C:
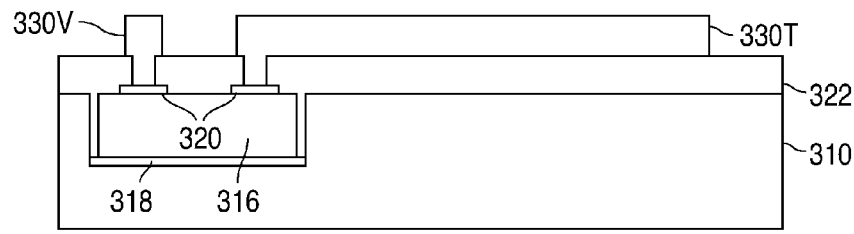

As shown in FIGS. 9A-9C, after non-conductive structure 322 has been formed, a number of metal lower structures 330 are formed to touch non-conductive structure 322. The metal lower structures 330 include via structures 330V that touch a first group of the conductive pads 320, via trace structures 330T that touch a second group of the conductive pads 320, and a number of lower coil structures 330C. The metal lower structures 330 can be formed in a number of different ways.

Figure 10A:
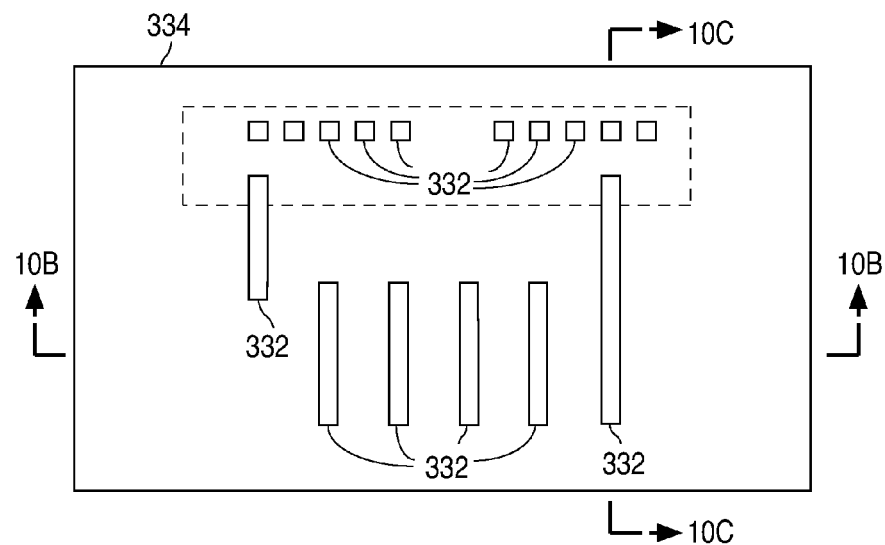
Figure 10B:
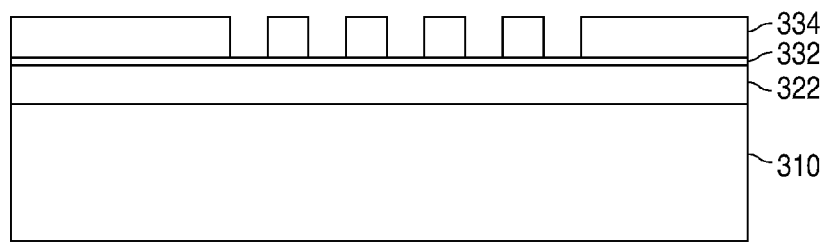
Figure 10C:
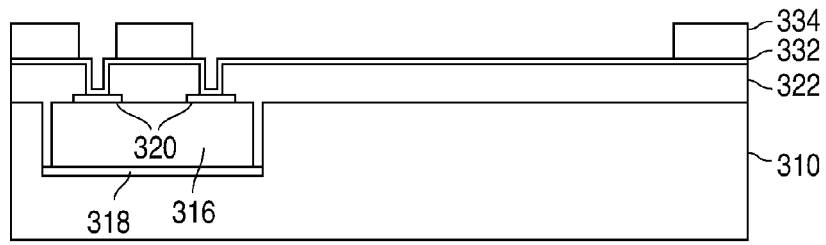

As shown in FIGS. 10A-10C, in a first embodiment, the metal lower structures 330 can be formed by depositing a seed layer 332 to touch non-conductive structure 322 and the conductive pads 320. Seed layer 332 can be formed by depositing 300 Å of titanium followed by 6000 Å of copper. After seed layer 332 has been formed, a plating mold 334 is formed on the top surface of seed layer 332.

Figure 11A:
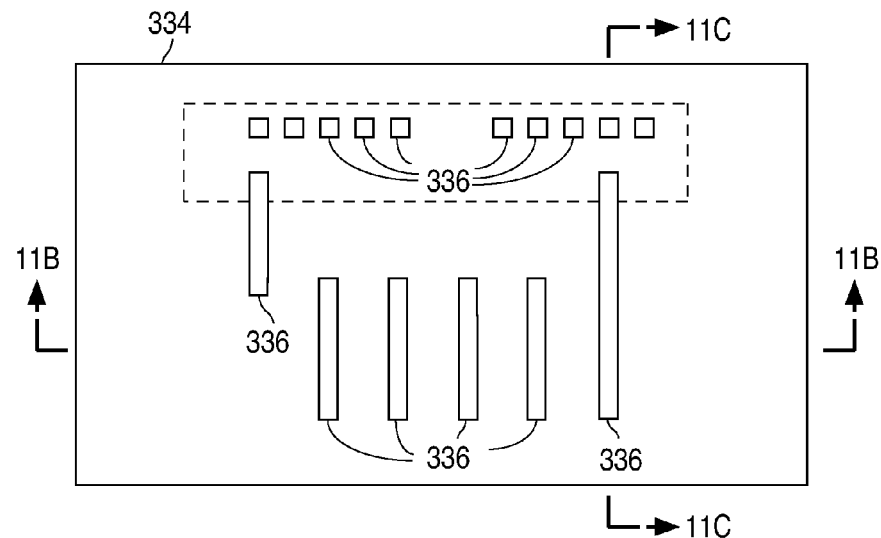
Figure 11B:
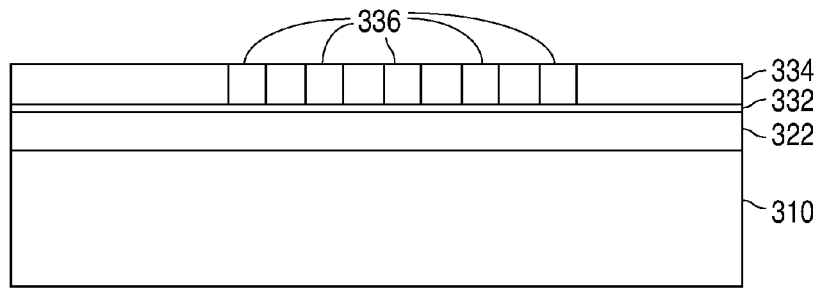
Figure 11C:
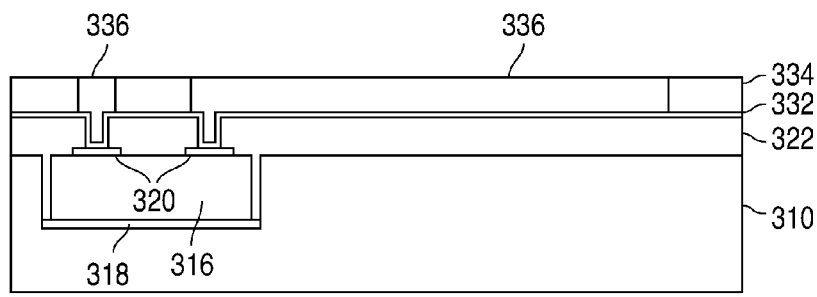
Figure 12A:
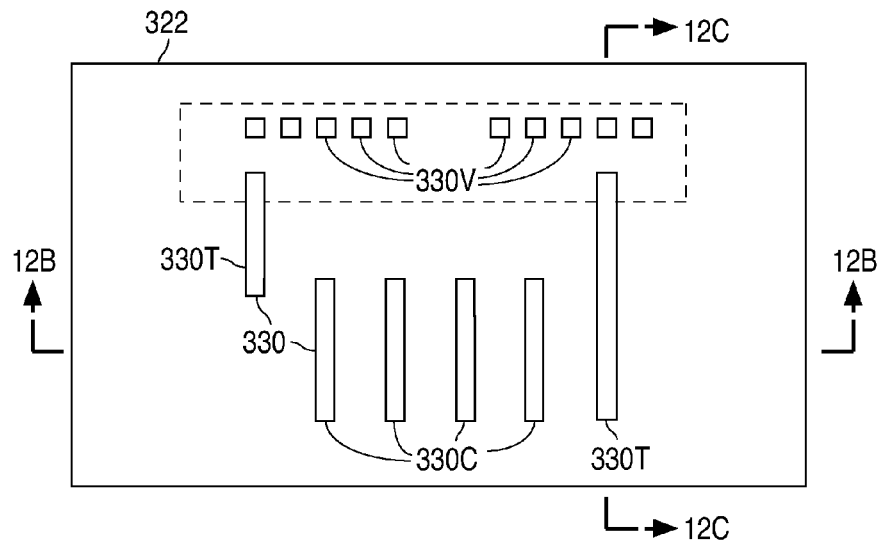
Figure 12B:
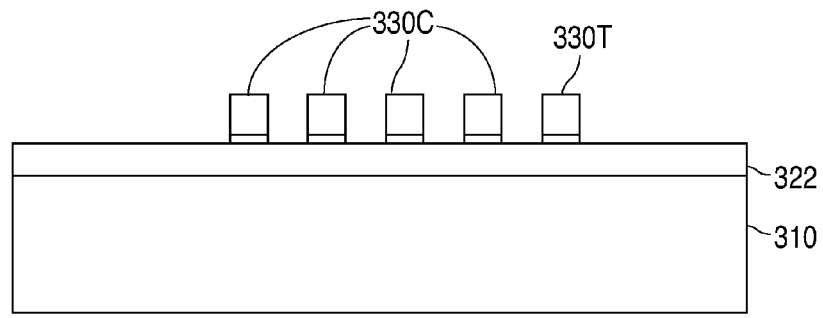
Figure 12C:
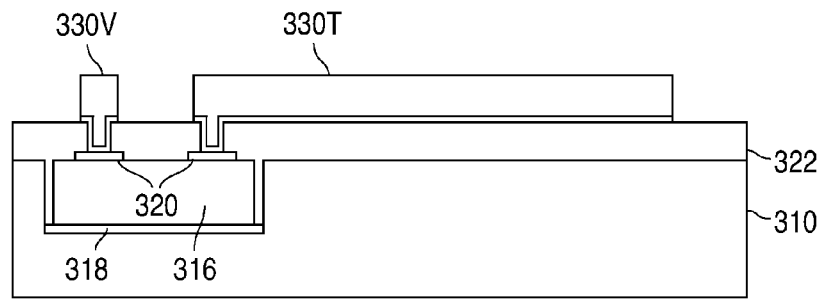

As shown in FIGS. 11A-11C, following the formation of plating mold 334, copper is electroplated in a conventional manner to form a number of copper regions 336 approximately 10 μm thick. After the electroplating, as shown in FIGS. 12A-12C, plating mold 334 and the underlying regions of seed layer 332 are removed to form the via structures 330V, the via trace structures 330T, and the lower coil structures 330C.

Figure 13A:
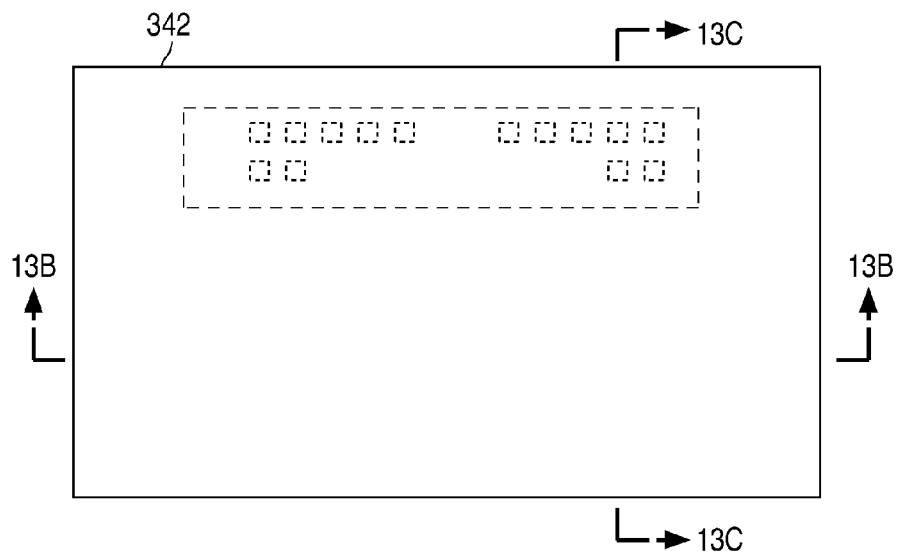
Figure 13B:
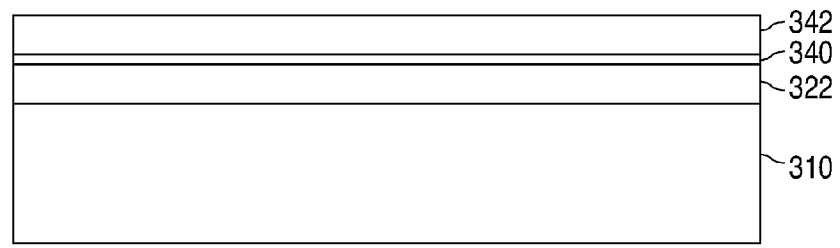
Figure 13C:
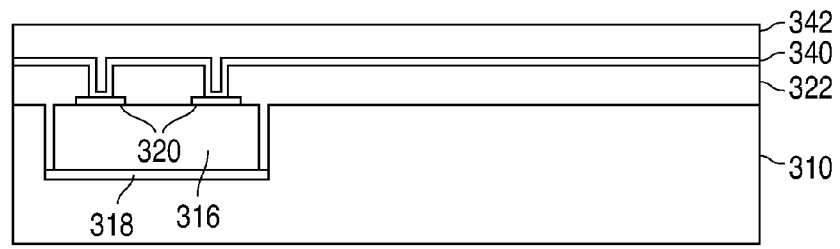

Alternately, in a second embodiment, as shown in FIGS. 13A-13C, the metal lower structures 330 can be formed by first depositing a liner layer 340 on non-conductive structure 322 to line the openings 322P. Liner layer 340 can be implemented with, for example, titanium/titanium nitride. After liner layer 340 has been formed, a metal layer 342, such as tungsten, is conventionally deposited on liner layer 340 to fill up the openings 322P.

Figure 14A:
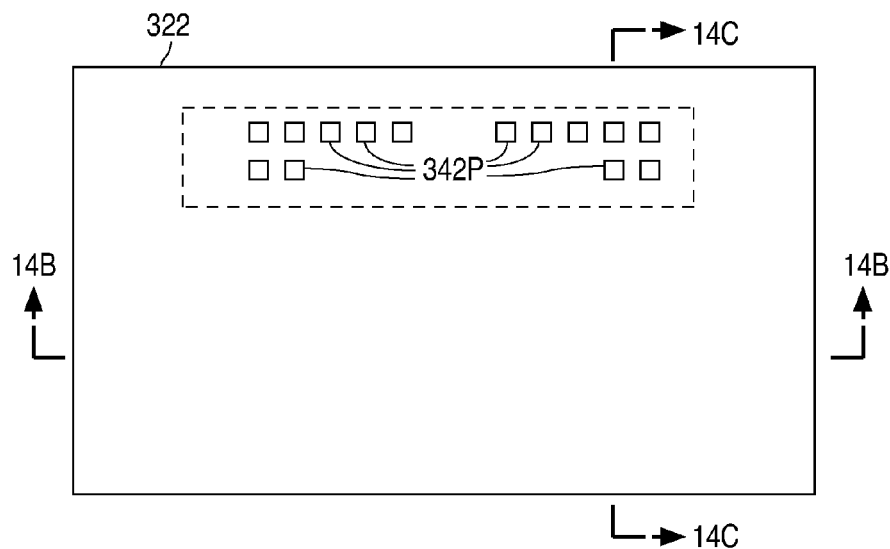
Figure 14B:
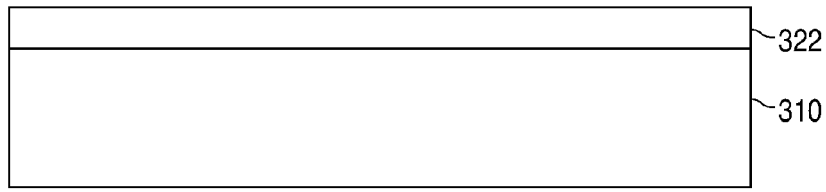
Figure 14C:
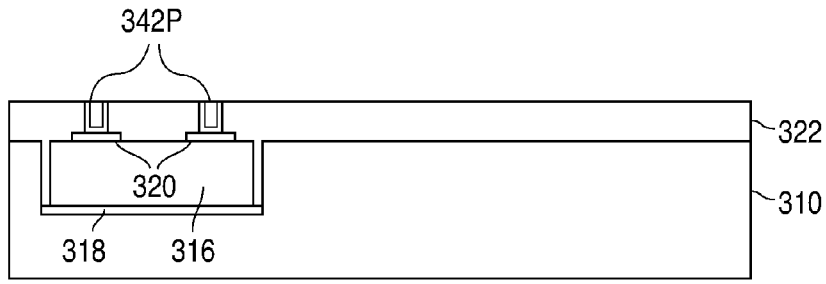

Following this, as shown in FIGS. 14A-14C, metal layer 342 is planarized, such as with chemical-mechanical polishing, to expose the top surface of non-conductive structure 322, and form via plug structures 342P in the openings 322P that make electrical connections to the conductive pads 320.

Figure 15A:
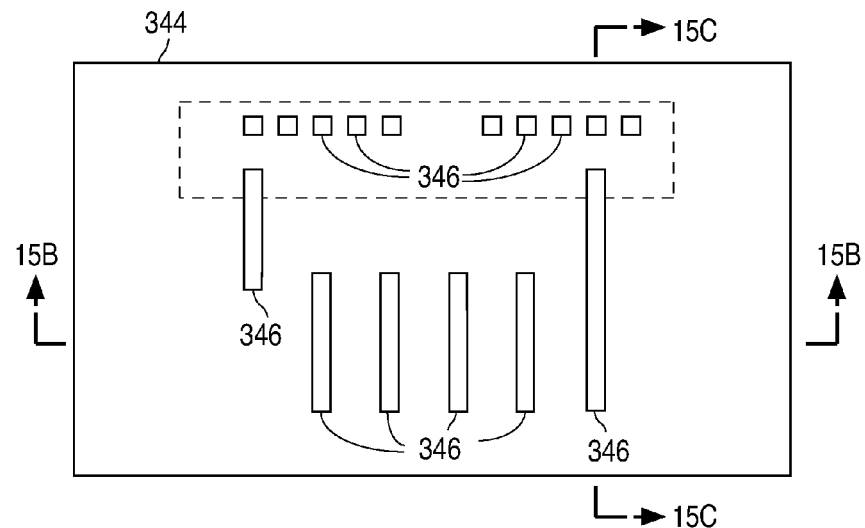
Figure 15B:
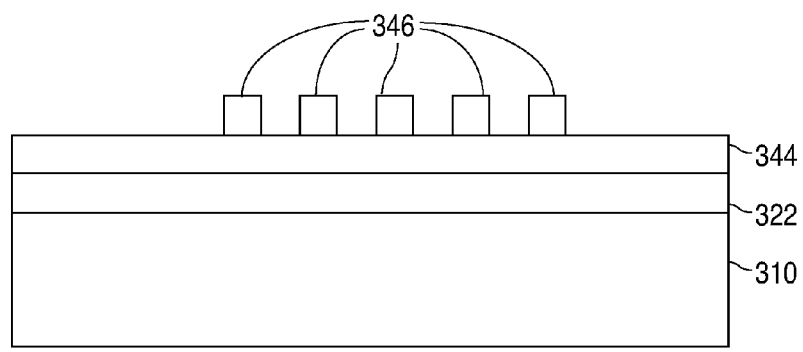
Figure 15C:
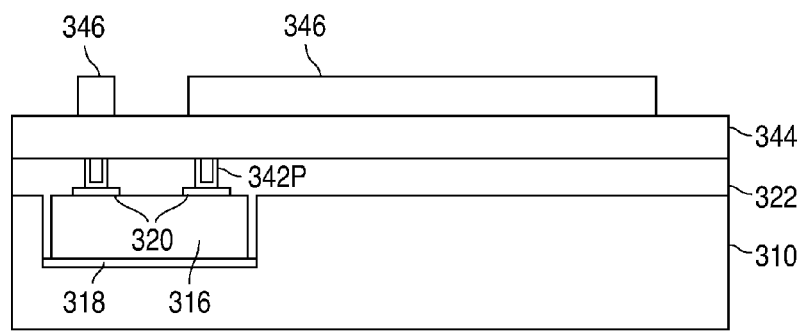

As shown in FIGS. 15A-15C, after the via plug structures 342P have been formed, a metal layer 344, such as aluminum, is sputter deposited onto non-conductive structure 322 to a depth of approximately 5 µm. Alternately, metal layer 344 can include multiple layers of metal such as, for example, a layer of titanium, a layer of titanium nitride, a layer of aluminum copper, a layer of titanium, and a layer of titanium nitride.

Once metal layer 344 has been formed, a patterned photoresist layer 346 approximately 1.0 µm thick is formed on the top surface of metal layer 344 in a conventional manner. Following the formation of patterned photoresist layer 346, metal layer 344 is etched to remove the exposed regions of metal layer 344 and form the metal lower structures 330.

Metal layer 344 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 346 is then removed in a conventional manner, such as with acetone. Once patterned photoresist layer 346 has been removed, the resulting structure is conventionally cleaned to remove organics, such as with a Piranha etch.

Figure 16A:
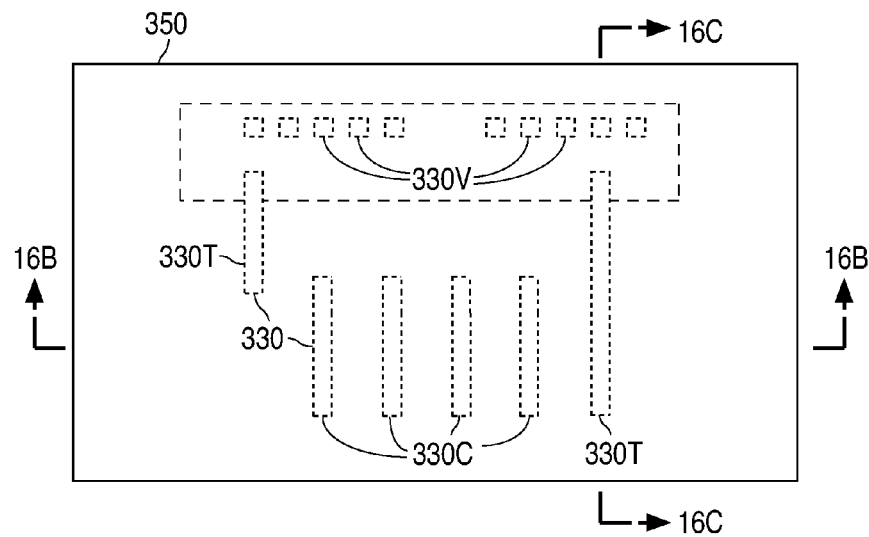
Figure 16B:
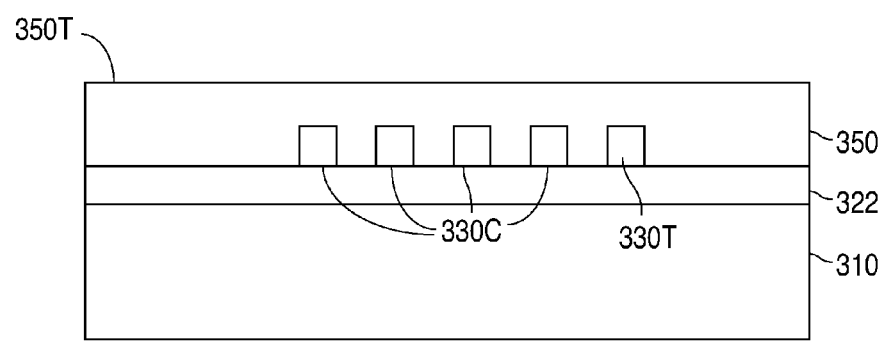
Figure 16C:
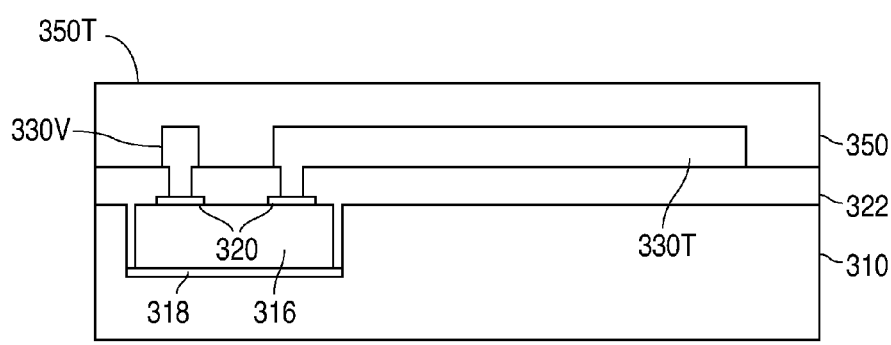

As shown in FIGS. 16A-16C, after the via structures 330V, the via trace structures 330T, and the lower coil structures 330C have been formed, a non-conductive structure 350 with a substantially planar top surface 350T is formed on non-conductive structure 322, the via structures 330V, the via trace structures 330T, and the lower coil structures 330C.

Figure 17A:
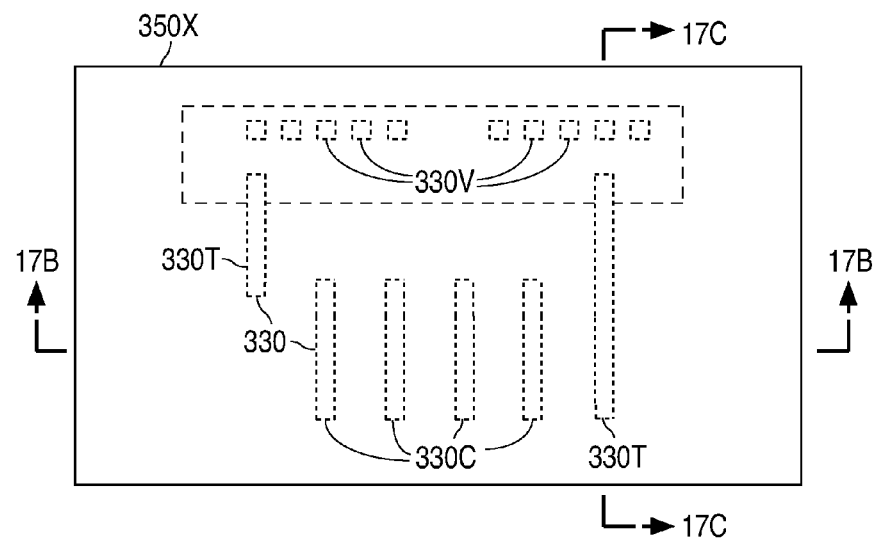
Figure 17B:
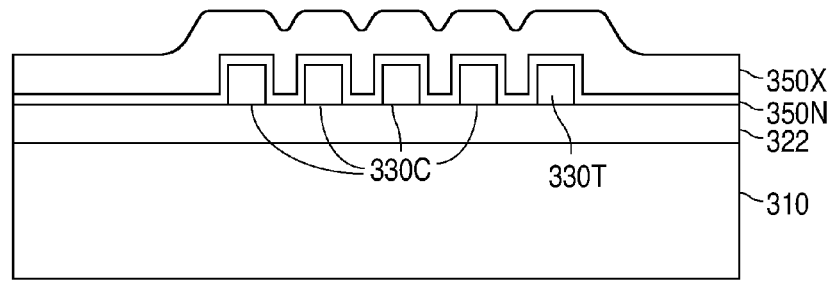
Figure 17C:
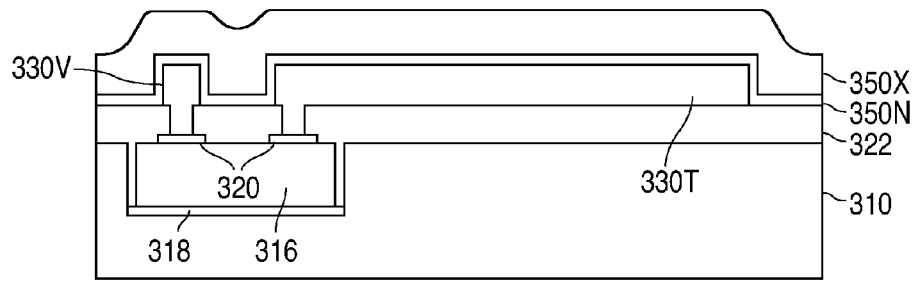

For example, as shown in FIGS. 17A-17C, non-conductive structure 350 can be formed by depositing a silicon nitride layer 350N approximately 0.6 µm thick on non-conductive structure 322 and the metal lower structures 330. After this, a layer of low temperature silicon dioxide 350X approximately 15 µm thick is conventionally formed on the top surface of silicon nitride layer 350N.

Figure 18A:
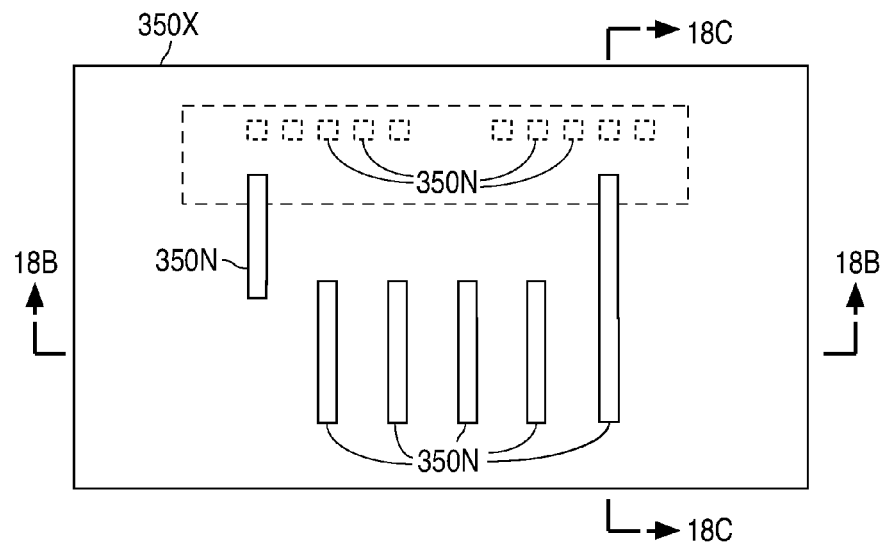
Figure 18B:
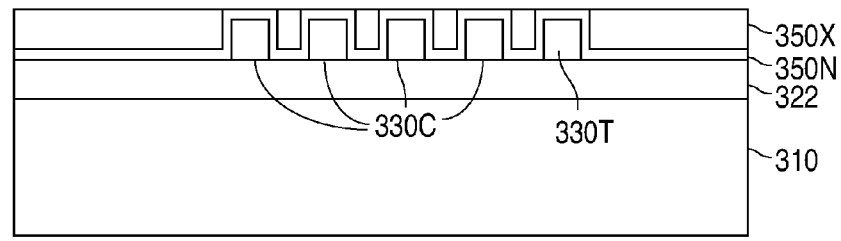
Figure 18C:
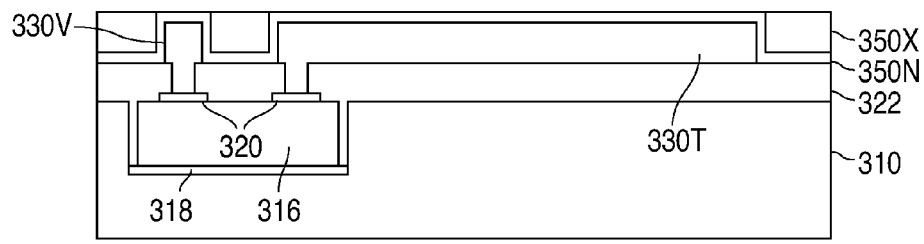
Figure 19A:
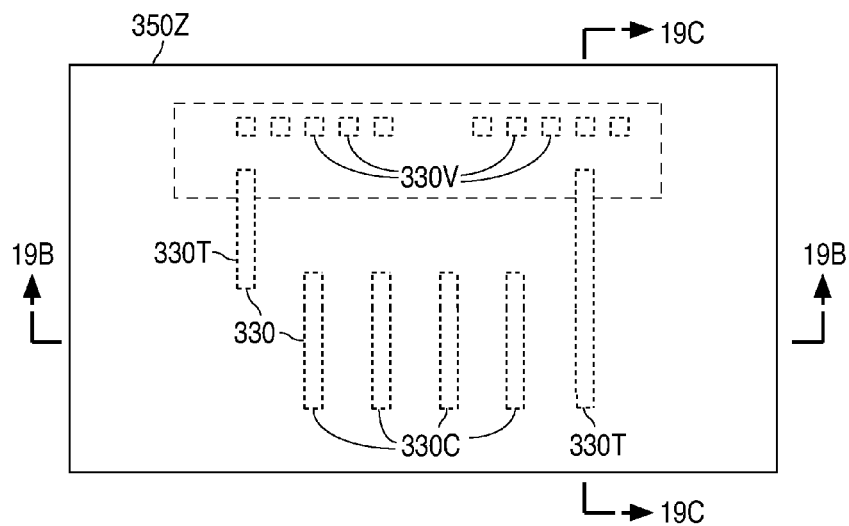
Figure 19B:
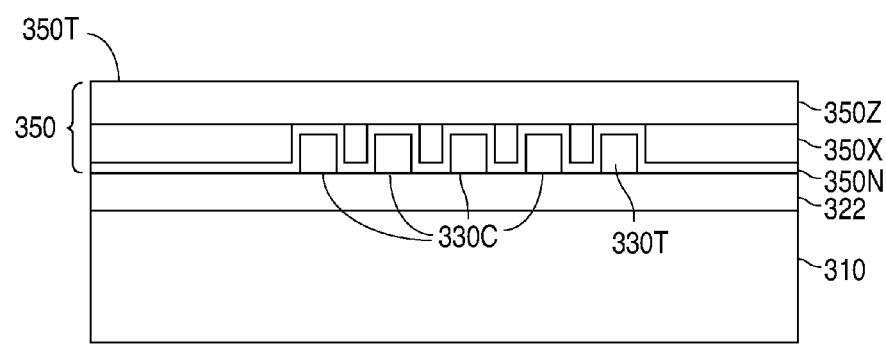
Figure 19C:
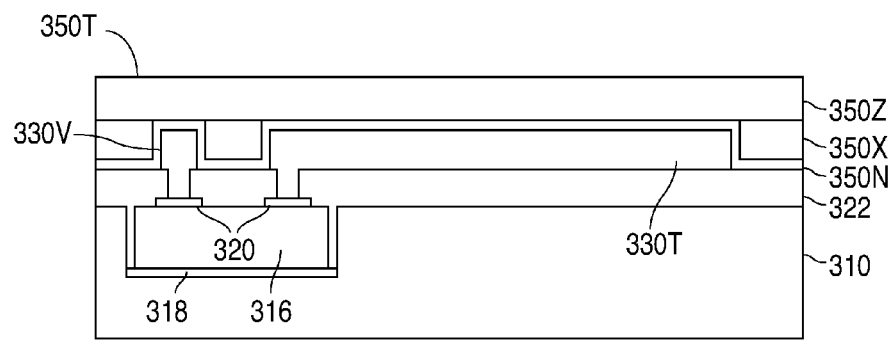

As shown in FIGS. 18A-18C, following the formation of oxide layer 350X, oxide layer 350X is planarized in a conventional manner, such as with chemical-mechanical polishing, until nitride layer 350N is exposed. As shown in FIGS. 19A-19C, after nitride layer 350N has been exposed, a silicon dioxide layer 350Z approximately 2 µm thick is deposited to form the substantially planar top surface 350T of non-conductive structure 350. Nitride layer 350N can optionally be omitted, with the planarization stopping on the metal lower structures 330.

Figure 20A:
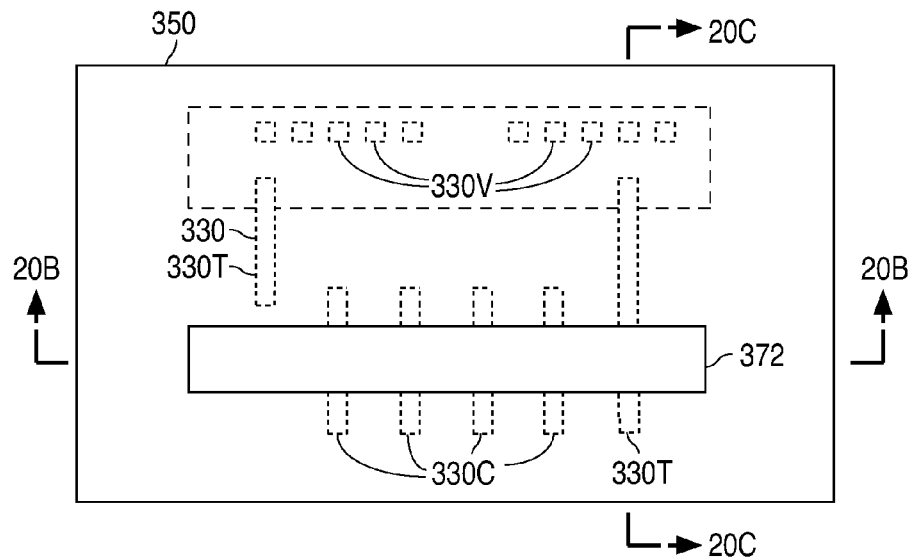
Figure 20B:
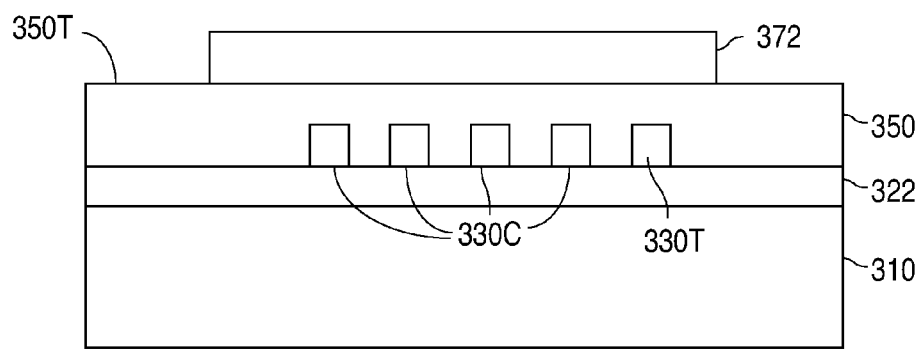
Figure 20C:
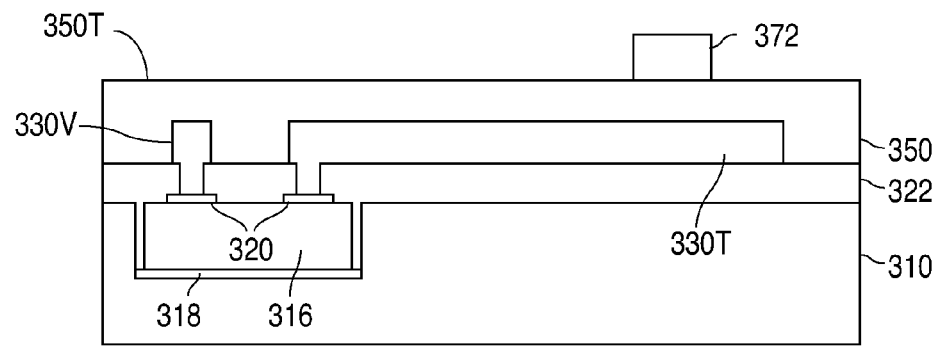

As shown in FIGS. 20A-20C, after non-conductive structure 350 has been formed, a number of thin-film magnetic structures 372 with high permeability, transverse anisotropy, and low resistance are formed on the top surface 350T of non-conductive structure 350 so that each magnetic structure 372 lies directly over a group of the lower coil structures 330C. (Only one magnetic structure 372 is shown for simplicity.)

The frequency response and sensitivity of the magnetic structures 372 are a strong function of the magnetic material that is used to form magnetic structure 372. Numerous materials can be sputtered or plated to form a magnetic structure as discussed in Phan, M. et al, "Giant magnetoimpedance materials: Fundamentals and applications", Progress in Materials Science, 53, 2008, pp. 323-420, which is hereby incorporated by reference. For example, an alloy of nickel and iron like permalloy or $Ni_{21}Fe_{79}$, cobalt tantalum zirconium (CoTaZr), and FeCoSiB can be used. In addition, a $Fe_{71}Al_2Si_{14}B_{8.5}Cu_1Nb_{3.5}$ nanocrystalline ribbon can also be used. Magnetic structure 372, in turn, can be formed in a number of ways.

Figure 21A:
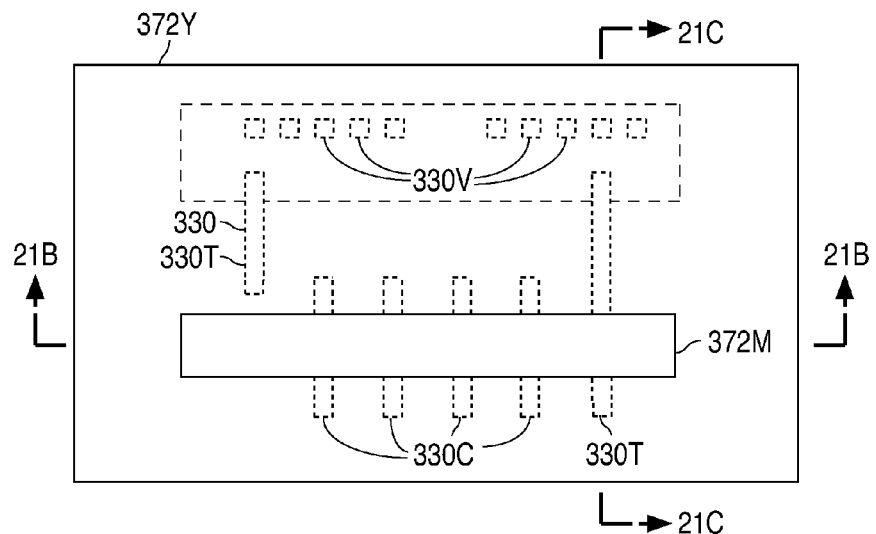
Figure 21B:
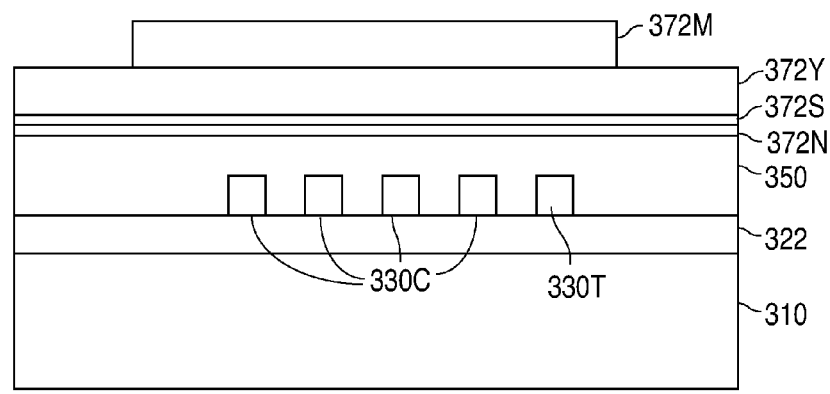
Figure 21C:
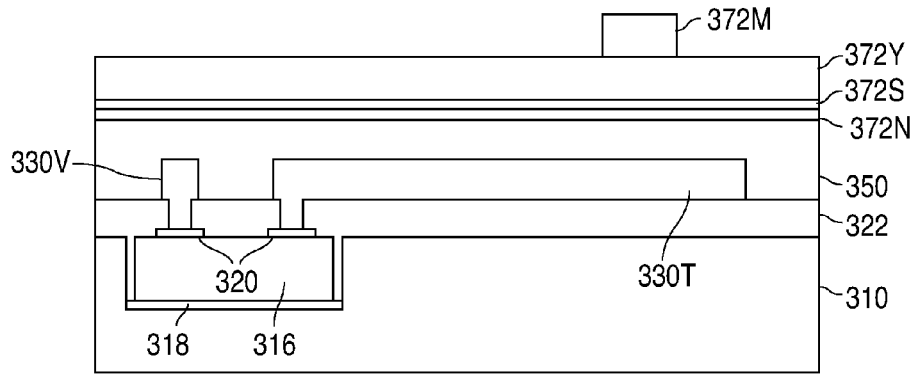

In a first embodiment, as shown in FIGS. 21A-21C, a layer of silicon nitride 372N approximately 0.6 µm thick is deposited on the top surface 350T of non-conductive structure 350, followed by the deposition of a seed layer 372S on the top surface of nitride layer 372N. Seed layer 372S can be formed by depositing 300 Å of titanium, 3000 Å of copper, and 300 Å of titanium.

After seed layer 372S has been formed, a magnetic material is electroplated to a thickness of, for example, 3-5 µm to form a magnetic material layer 372Y. Following this, a patterned photoresist layer 372M approximately 15 µm thick is formed on magnetic material layer 372Y in a conventional manner.

Figure 22A:
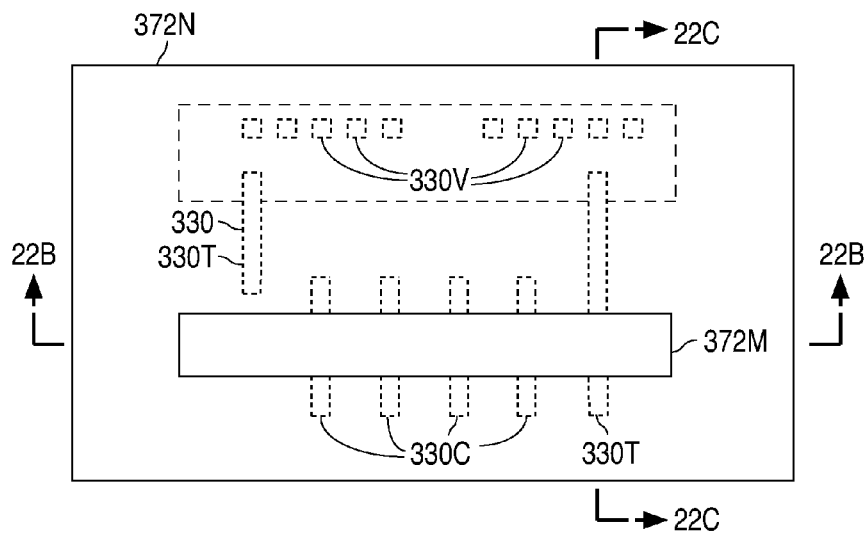
Figure 22B:
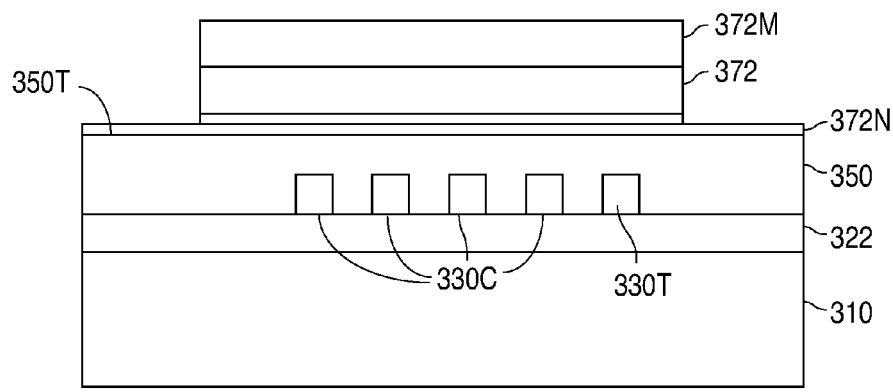
Figure 22C:
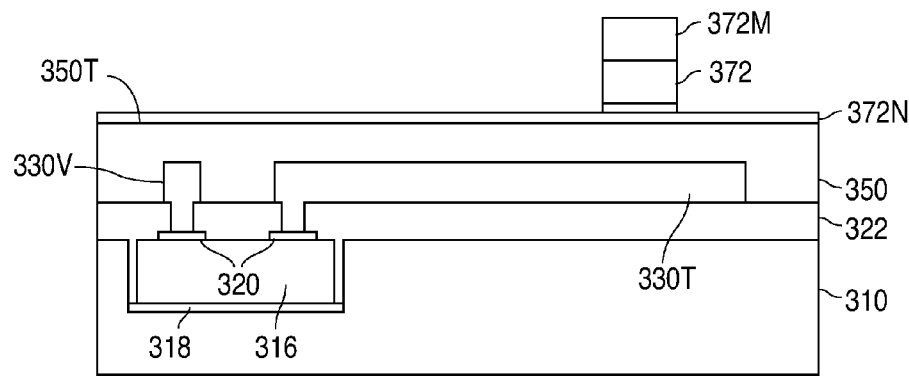

Next, as illustrated in FIGS. 22A-22C, the exposed regions of magnetic material layer 372Y and seed layer 372S are etched and removed to form the magnetic structures 372. In this example, nitride layer 372N is left in place, but the exposed regions of nitride layer 372N could alternately be removed. Patterned photoresist layer 372M is then removed in a conventional manner, such as with acetone. Once patterned photoresist layer 372M has been removed, the resulting structure is conventionally cleaned to remove organics, such as with a Piranha etch. In addition, a plating mold can alternately be used to define the regions where the magnetic material is to be electroplated.

Figure 23A:
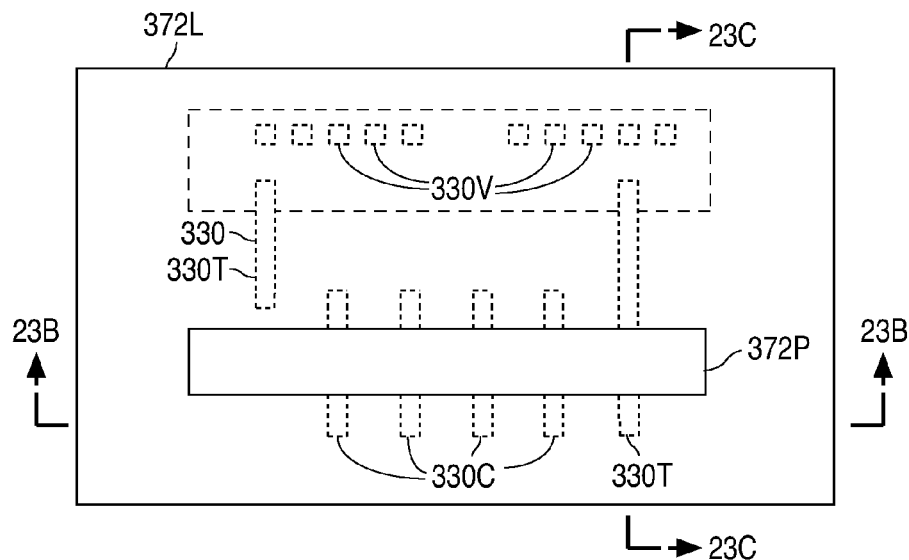
Figure 23B:
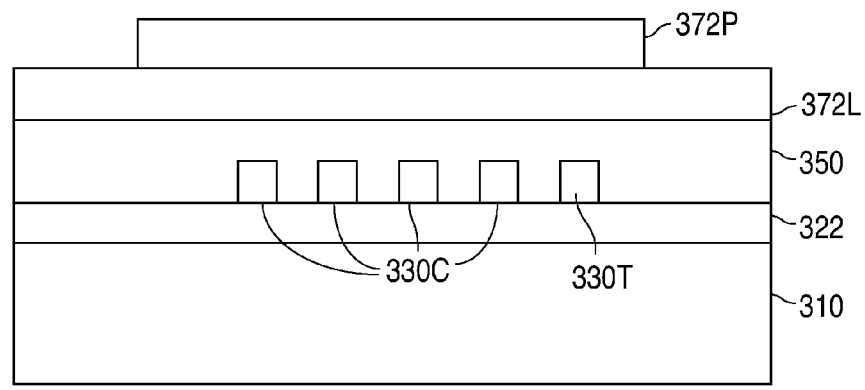
Figure 23C:
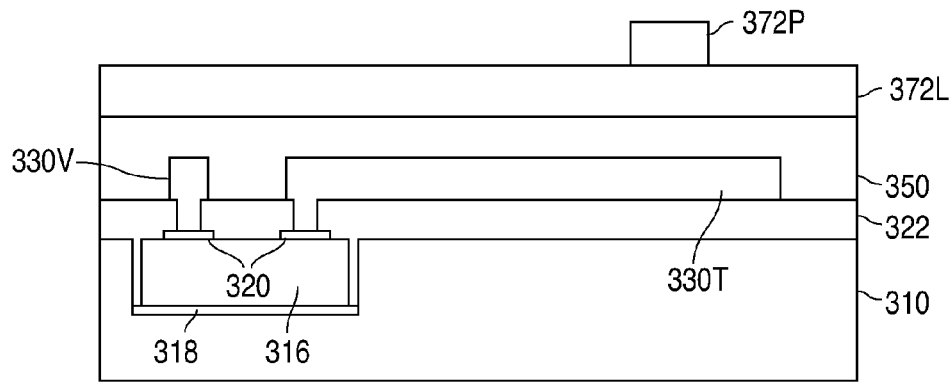

In a second embodiment, as shown in FIGS. 23A-23C, a magnetic material layer 372L approximately 3-5 µm thick is sputter deposited on to the top surface 350T of non-conductive structure 350. Following this, a patterned photoresist layer 372P approximately 15 µm thick is conventionally formed on magnetic material layer 372L.

After patterned photoresist layer 372P has been formed, the exposed regions of magnetic material layer 372L are etched (e.g., wet etched) and removed to form the magnetic structures 372. Patterned photoresist layer 372P is then removed in a conventional manner, such as with acetone. Once patterned photoresist layer 372P has been removed, the resulting structure is conventionally cleaned to remove organics, such as with a Piranha etch.

Figure 24A:
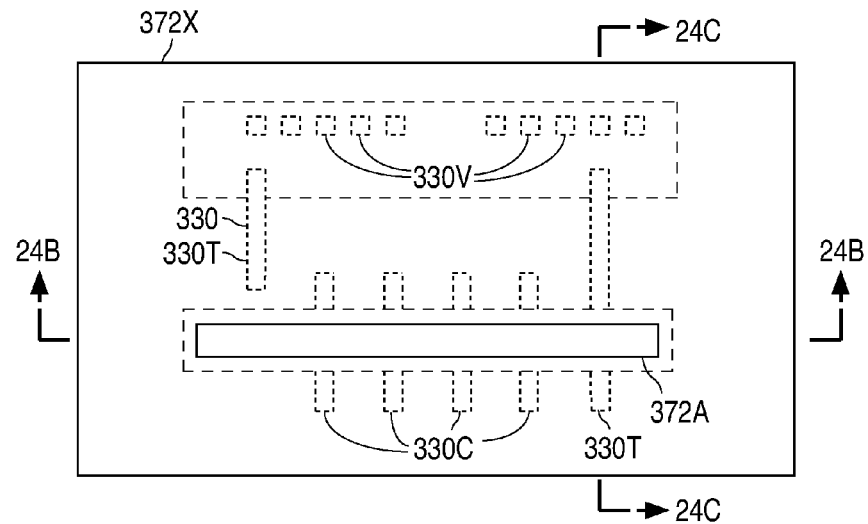
Figure 24B:
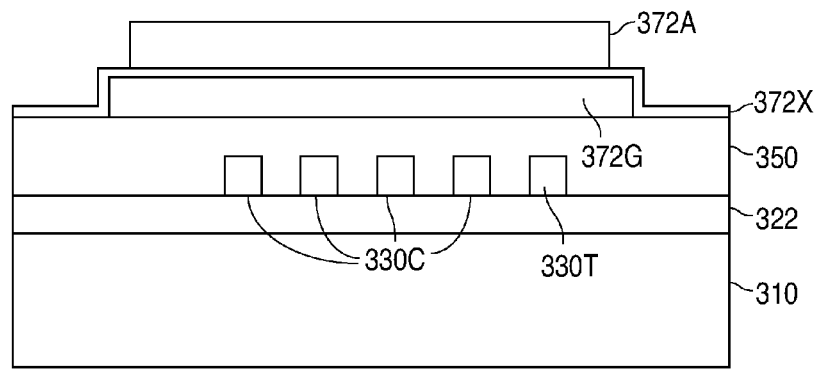
Figure 24C:
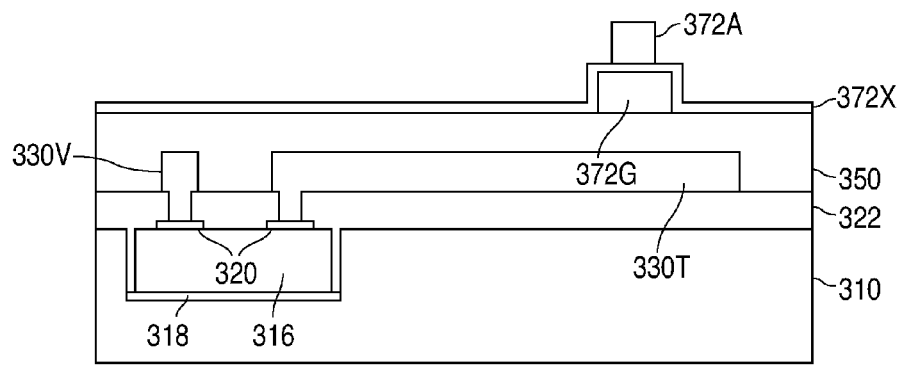

In a third embodiment, the method begins as with the second embodiment such that the etch of magnetic material layer 372L forms lower magnetic elements 372G. (Only one lower magnetic element is shown for simplicity.) After patterned photoresist layer 372P has been removed and the structure cleaned, as shown in FIGS. 24A-24C, a sandwich layer 372X, such as a layer of silicon dioxide or copper, is deposited on non-conductive structure 350 and the lower magnetic elements 372G. Following this, a patterned photoresist layer 372A is formed on sandwich layer 372X in a conventional manner.

Figure 25A:
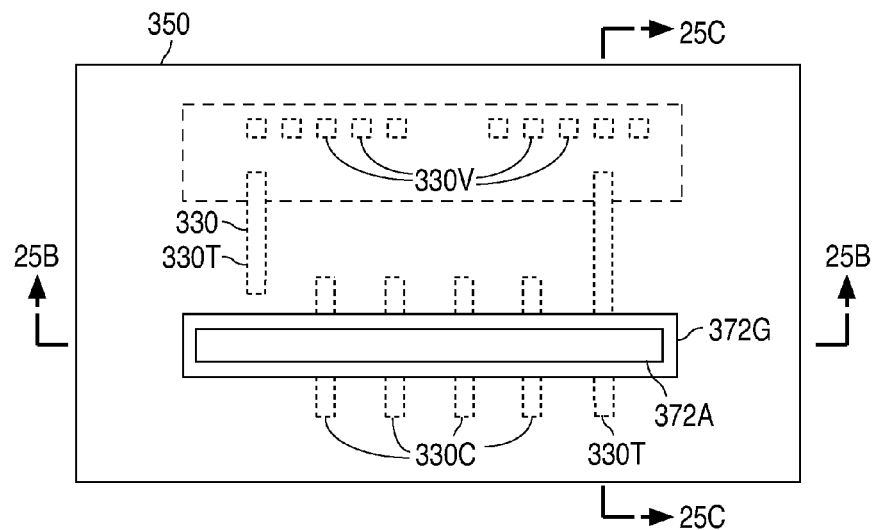
Figure 25B:
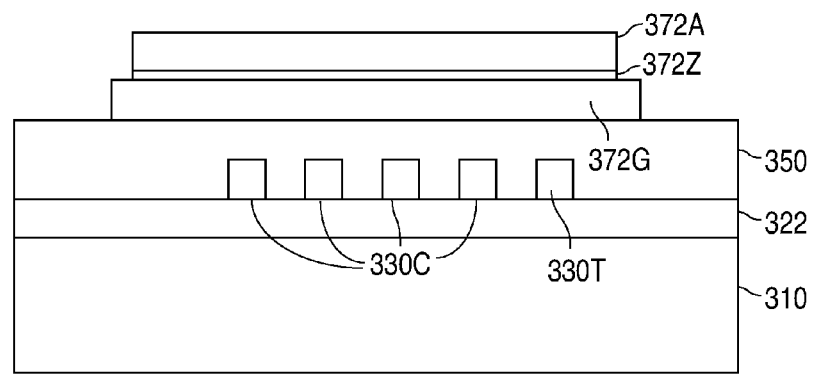
Figure 25C:
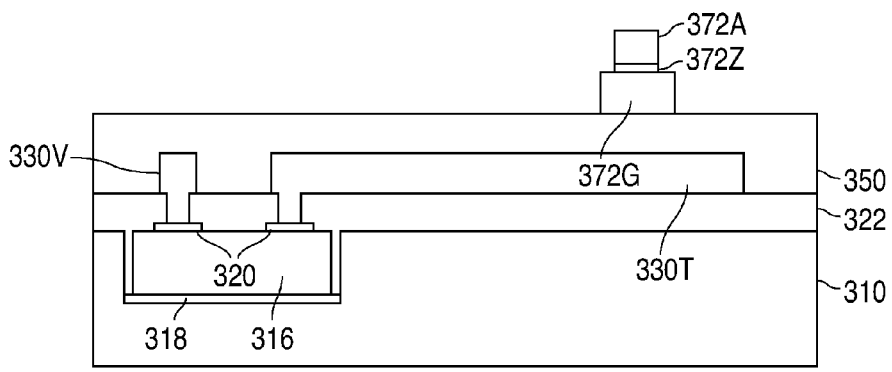

As shown in FIGS. 25A-25C, after patterned photoresist layer 372A has been formed, the exposed regions of sandwich layer 372X are etched and removed to form an inner structure 372Z on each lower magnetic element 372G. (Only one inner structure 372Z is shown for simplicity.) Patterned photoresist layer 372A is then removed in a conventional manner, such as with acetone. Once patterned photoresist layer 372A has been removed, the resulting structure is conventionally cleaned to remove organics, such as with a Piranha etch.

Figure 26A:
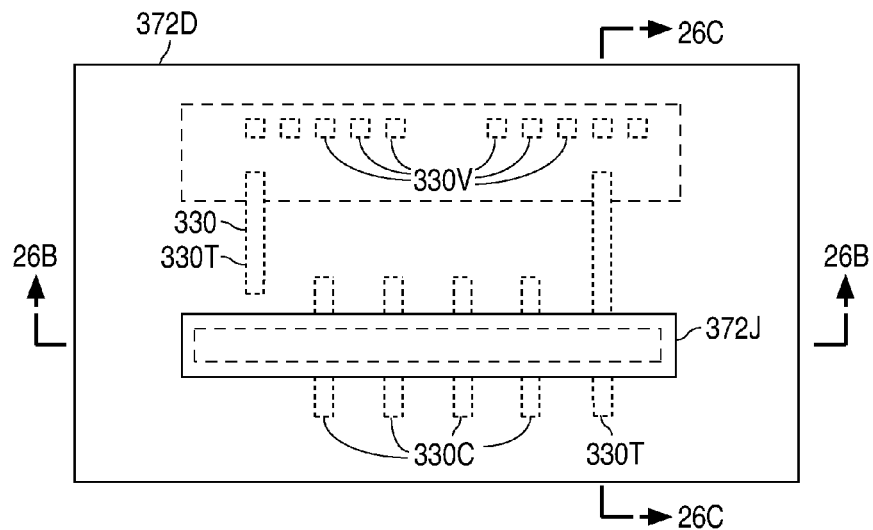
Figure 26B:
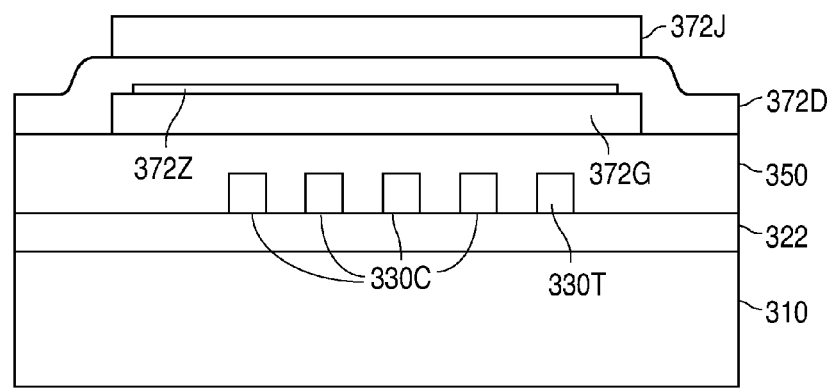
Figure 26C:
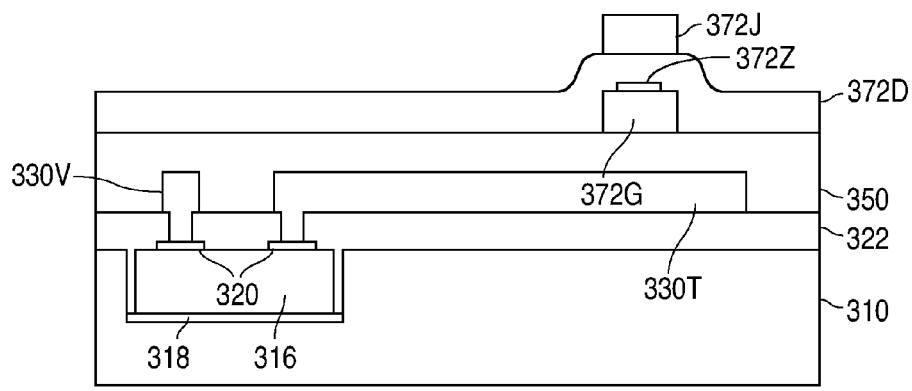

As shown in FIGS. 26A-26C, after patterned photoresist layer 372A has been removed and the structure cleaned, a magnetic material layer 372D is sputter deposited on the top surface 350T of non-conductive structure 350, the lower magnetic elements 372G, and the inner structures 372Z. Magnetic material layer 372D can be implemented with the same or different materials than magnetic material layer 372L. Following this, a patterned photoresist layer 3723 is formed on magnetic material layer 372D in a conventional manner.

As shown in FIGS. 27A-27C, after patterned photoresist layer 372A has been formed, the exposed regions of magnetic material layer 372D are etched and removed to form upper magnetic elements 372E. The etch also forms the magnetic structures 372 where, in this example, each magnetic structure 372 has a sandwich structure that includes a lower magnetic element 372G, an inner structure 372Z, and an upper magnetic element 372E. Patterned photoresist layer 3723 is then removed in a conventional manner, such as with acetone. Once patterned photoresist layer 3723 has been removed, the resulting structure is conventionally cleaned to remove organics, such as with a Piranha etch.

In the present example, the magnetic materials 372Y, 372L, and 372D are subjected to the presence of a strong magnetic field (e.g., 200 Oe) so that the magnetic materials 372Y, 372L, and 372D are circumferentially or transversely anisotropic. The strong magnetic field can be applied during the plating or deposition of the magnetic material. Alternately, the strong magnetic field can be applied during an anneal at elevated temperatures after the plating or deposition of the magnetic material.

Figure 28A:
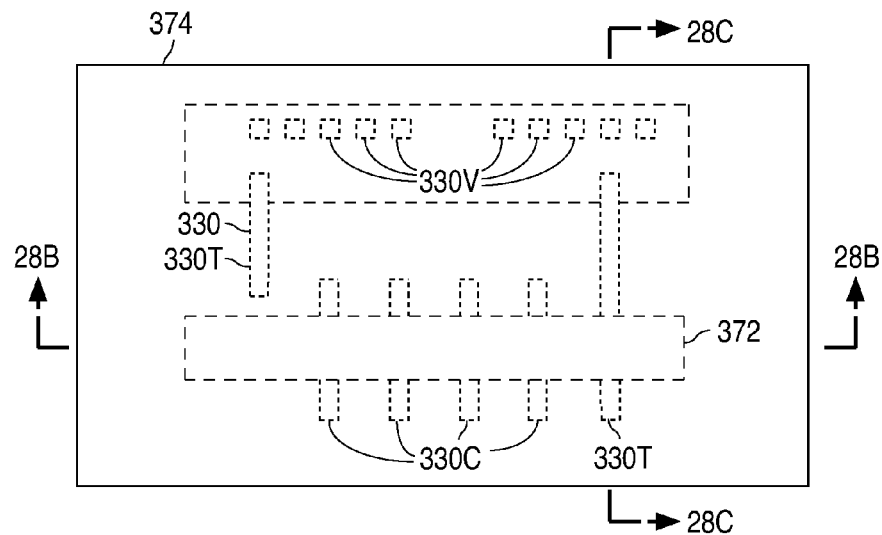
Figure 28B:
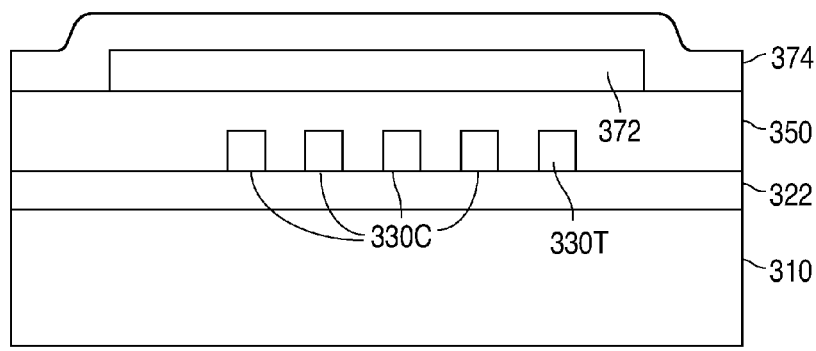
Figure 28C:
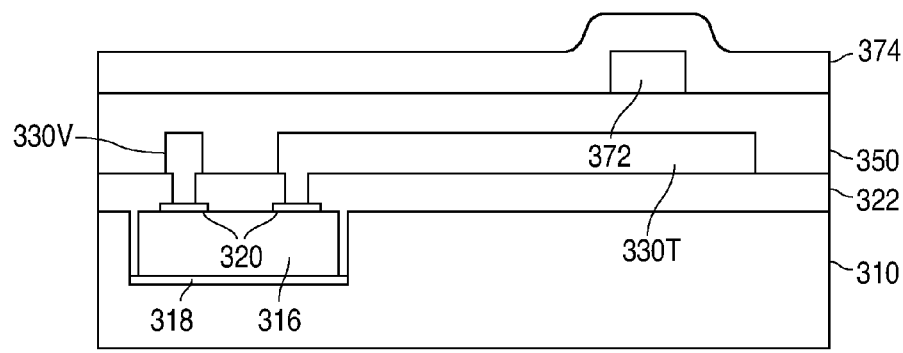
Figure 29A:
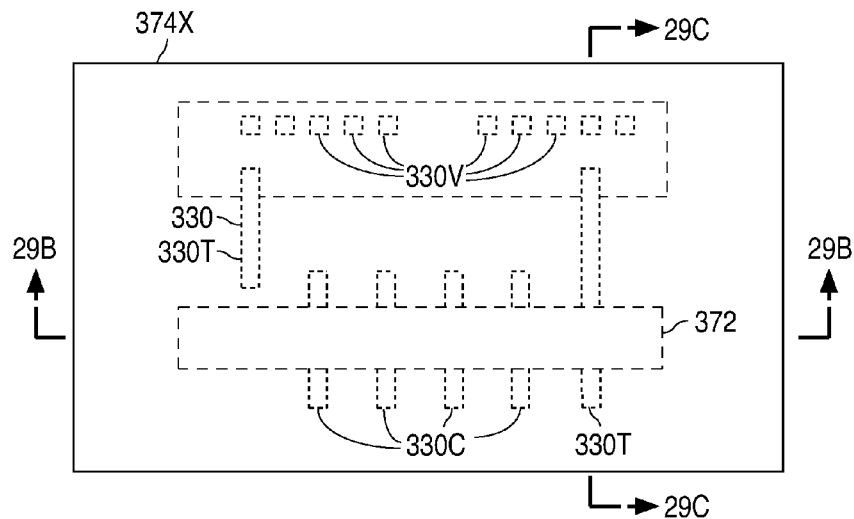
Figure 29B:
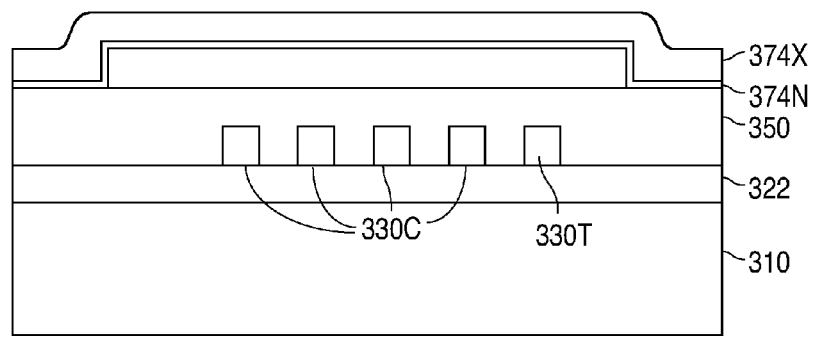
Figure 29C:
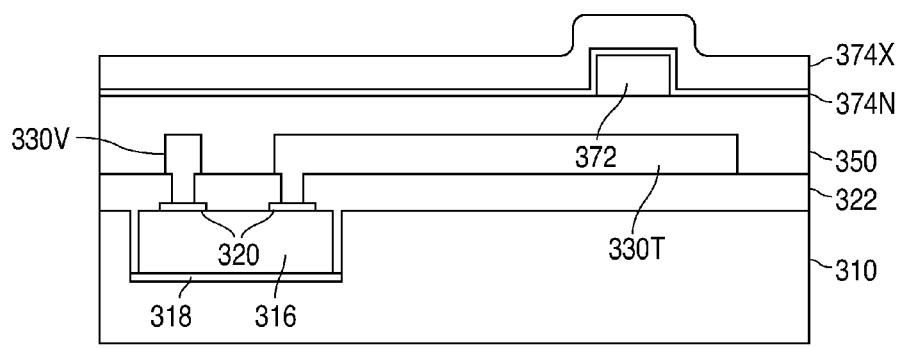

Following the formation of the magnetic structures 372, as shown in FIGS. 28A-28C, a non-conductive structure 374 approximately 2 µm thick is formed on non-conductive structure 350 and the magnetic structures 372. For example, as shown in FIGS. 29A-29C, non-conductive structure 374 can be formed by conventionally depositing a silicon nitride layer 374N approximately 0.6 µm thick on non-conductive structure 350 and the magnetic structures 372. After this, a layer of silicon dioxide 374X approximately 2 um thick is conventionally formed on the top surface of silicon nitride layer 374N. Silicon nitride layer 374 can optionally be omitted.

Figure 30A:
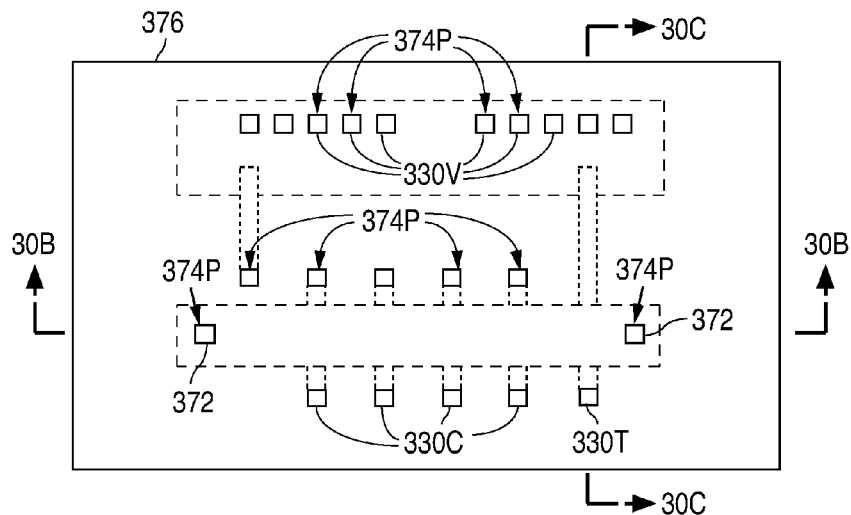
Figure 30B:
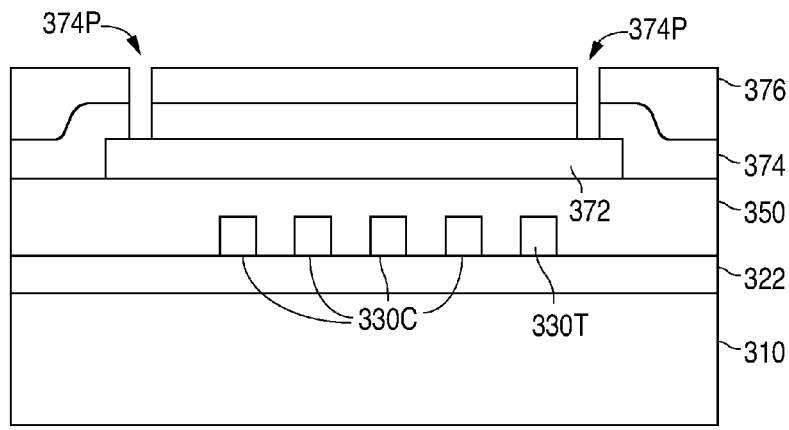
Figure 30C:
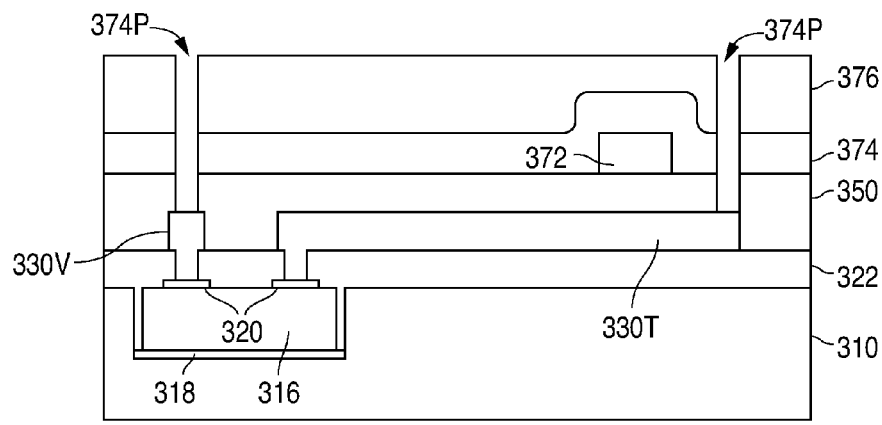

As shown in FIGS. 30A-30C, after non-conductive structure 374 has been formed, a patterned photoresist layer 376 approximately 15 µm thick is formed on the top surface of non-conductive structure layer 374 in a conventional manner. Following the formation of patterned photoresist layer 376, non-conductive structure 374 and non-conductive structure 350 are etched (e.g., dry etched) to form a number of openings 374P that expose the via structures 330V, one end of each via trace 330T, the opposite ends of each lower coil structure 330C, and the opposite end regions of the magnetic structures 372. Patterned photoresist layer 376 is then removed in a conventional manner, such as with acetone. Once patterned photoresist layer 376 has been removed, the resulting structure is conventionally cleaned to remove organics, such as with a Piranha etch.

Figure 31A:
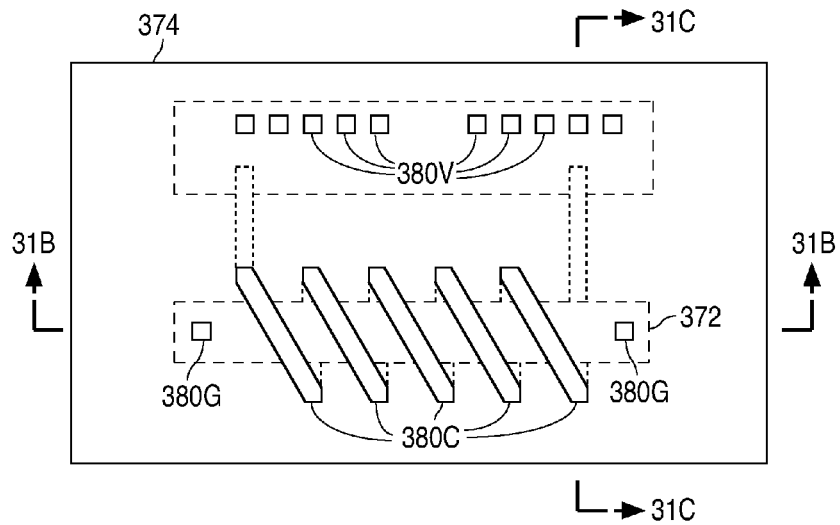
Figure 31B:
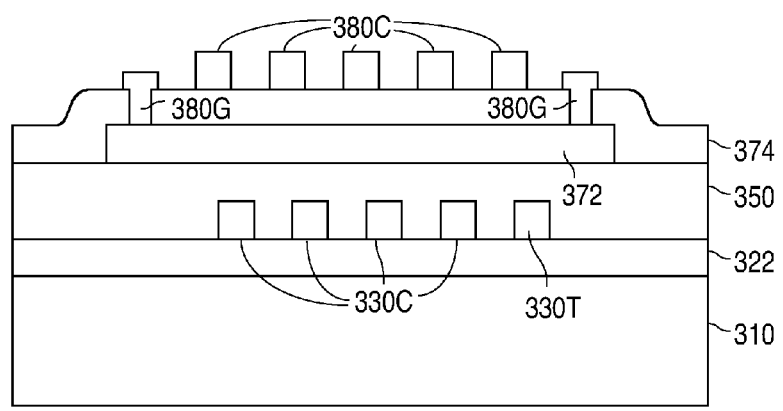
Figure 31C:
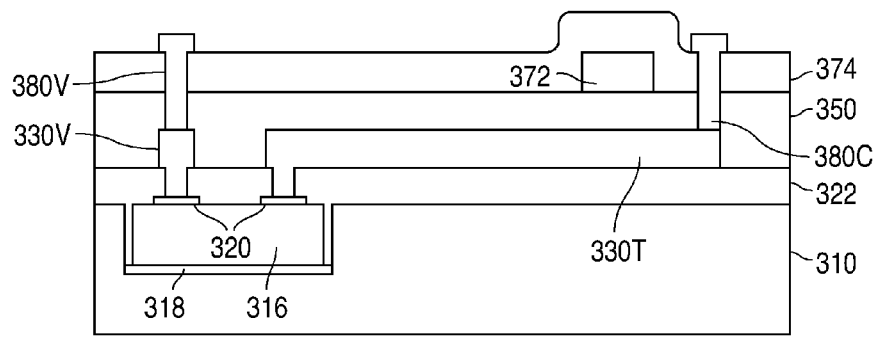

After the openings 374P have been formed, as shown in FIGS. 31A-31C, a number of metal upper structures 380 are formed to touch non-conductive structure 374. The metal upper structures 380 include via structures 380V that are connected to the via structures 330V, via structures 380G that are connected to the opposite ends of the magnetic structures 372, and upper coil structures 380C that are connected to the lower coil structures 330C and the ends of the via traces 330T. The electrical connection of the upper coil structures 380C and the lower coil structures 330C form sense coils 381 that are wrapped around the magnetic structures 372 as spirals. (Only one sense coil 381 is shown for simplicity.)

Figure 32A:
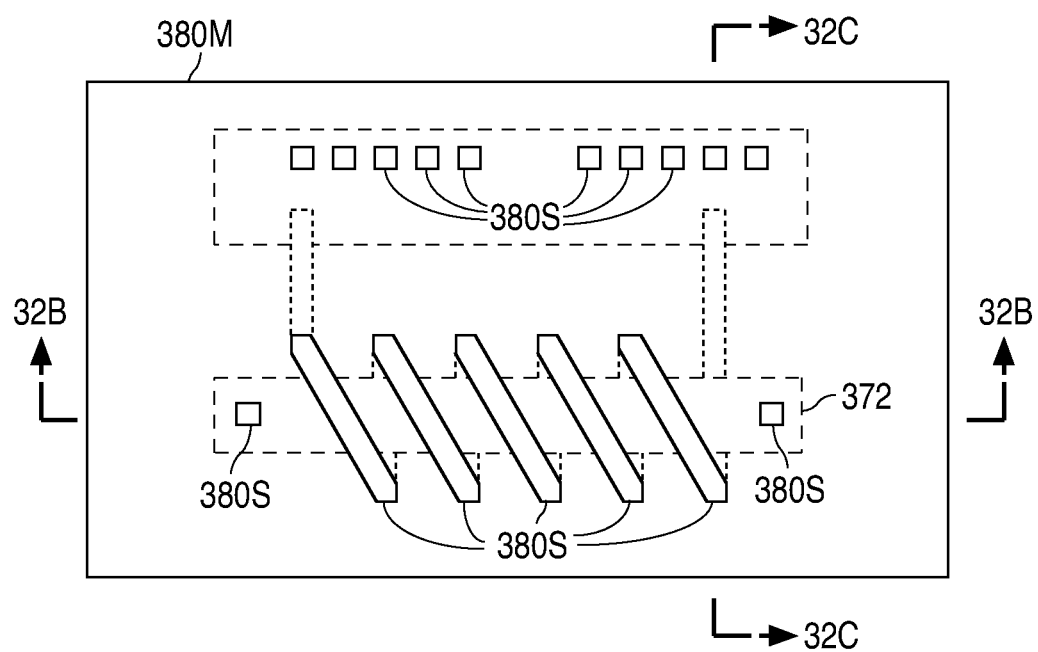
Figure 32B:
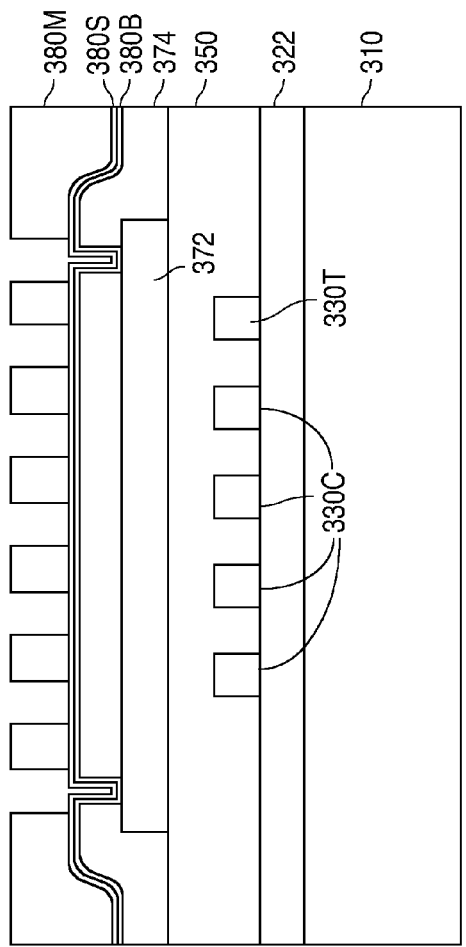
Figure 32C:
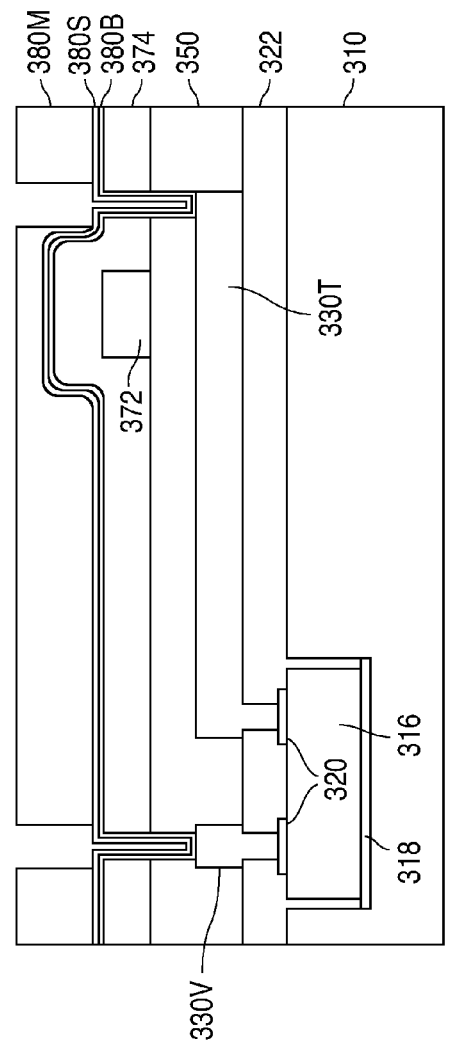

For example, as shown in FIGS. 32A-32C, the metal upper structures 380 can be formed by first depositing a copper diffusion barrier layer 380B on non-conductive structure 374 to line the openings 374P. Barrier layer 380B can be implemented with, for example, nitride, titanium nitride, titanium, or tantalum.

If barrier layer 380B is non-conductive, then a patterned photoresist layer is formed on barrier layer 380B, followed by an etch to remove a portion of barrier layer 380B. The portion removed by the etch exposes the top surfaces of the via structures 330V, the opposite ends of the magnetic structures 372, the lower coil structures 330C, and the ends of the via traces 330T. After barrier layer 380B, which is illustrated as a conductive barrier layer, has been formed, a seed layer 380S is conventionally formed on barrier layer 380B (and the top surfaces of the via structures 330V, the opposite ends of the magnetic structures 372, the lower coil structures 330C, and the ends of the via traces 330T when a non-conductive barrier layer is used). Seed layer 380S can be formed by depositing 300 Å of titanium followed by 6000 Å of copper. After seed layer 380S has been formed, a plating mold 380M approximately 15 µm thick is formed on the top surface of seed layer 380S.

Figure 33A:
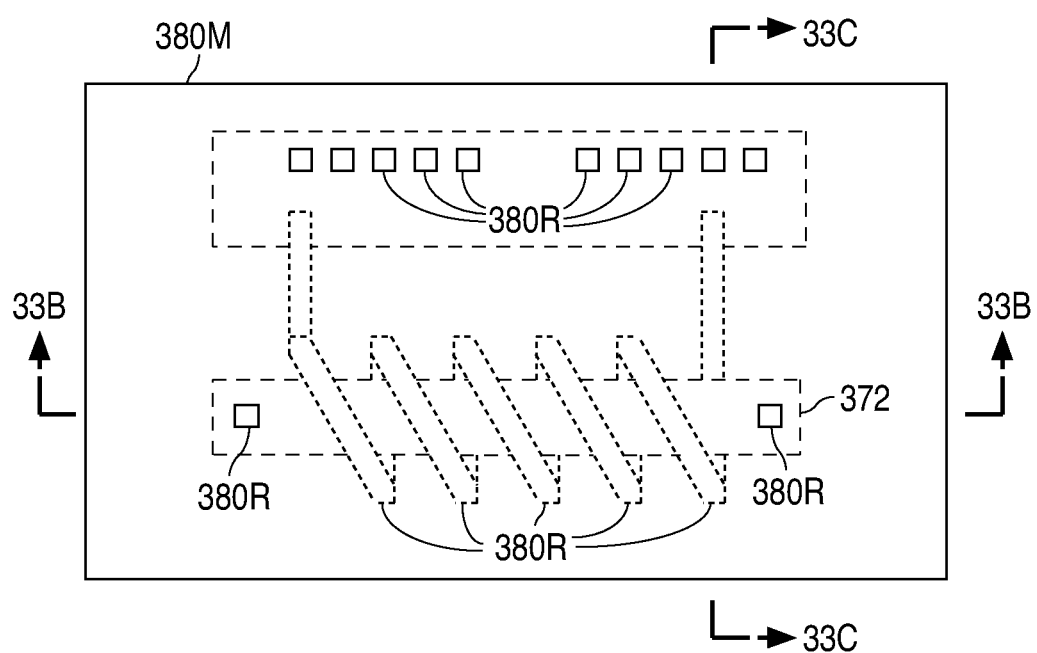
Figure 33B:
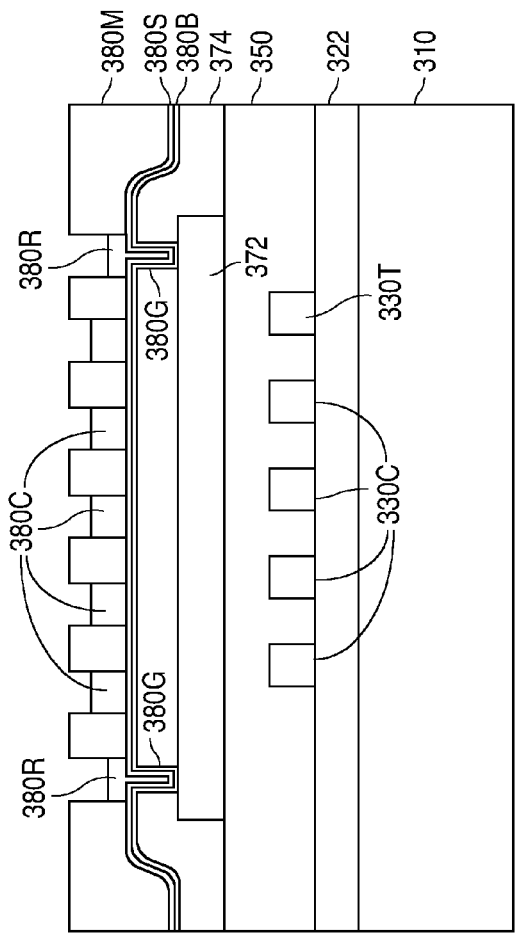
Figure 33C:
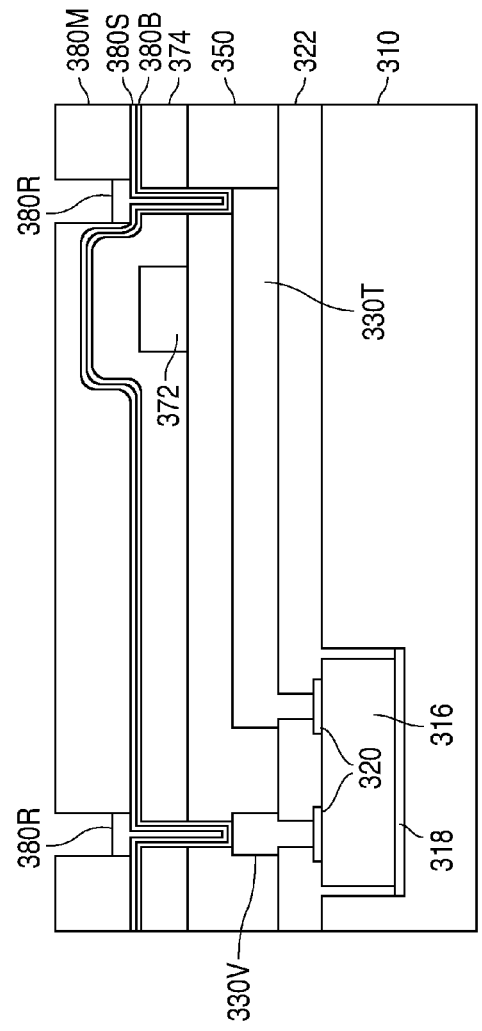
Figure 34A:
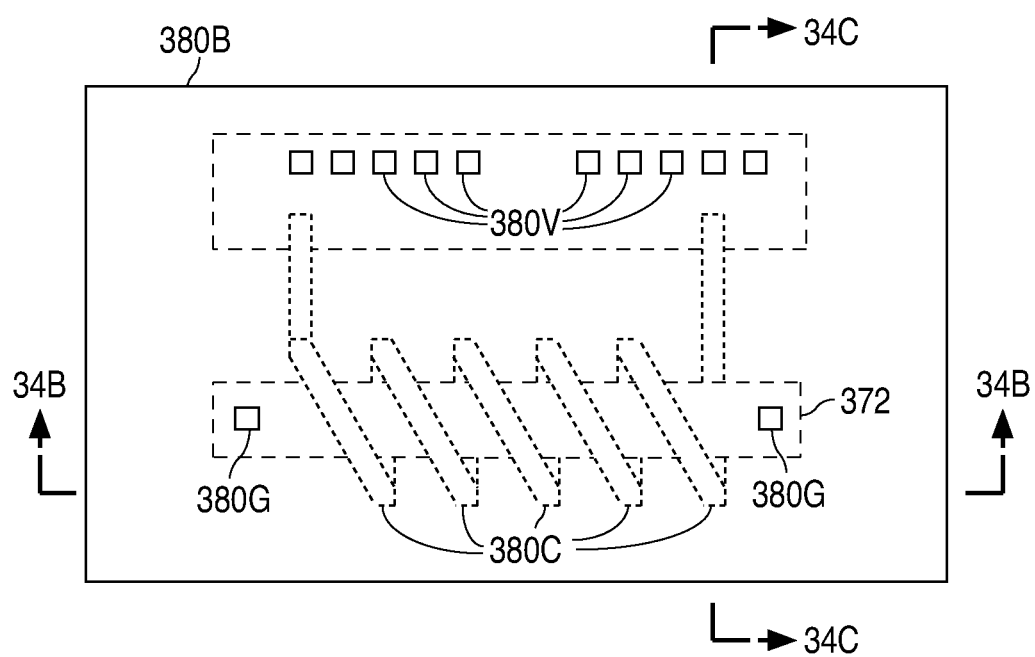
Figure 34B:
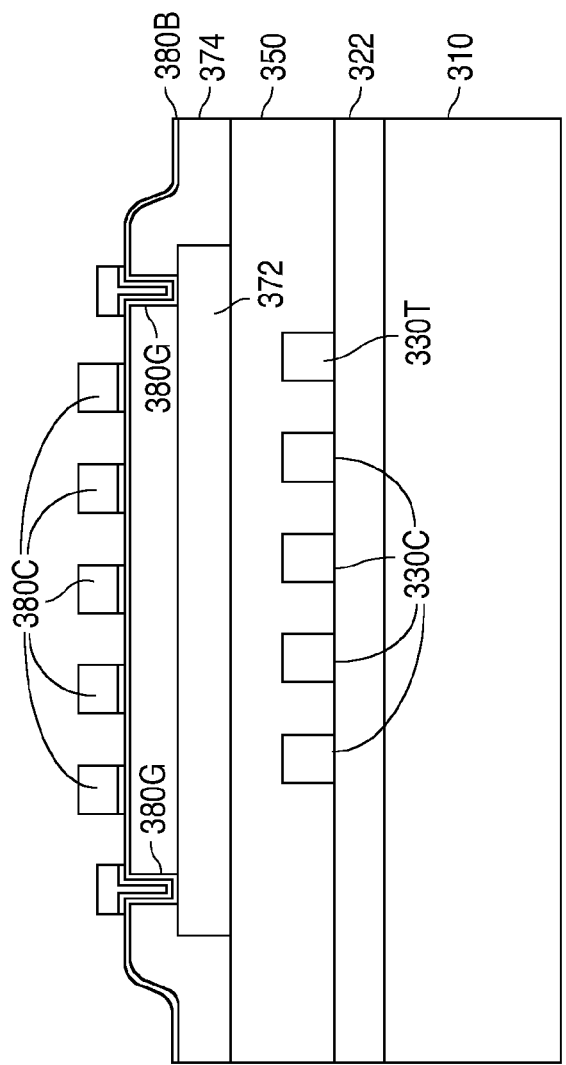
Figure 34C:
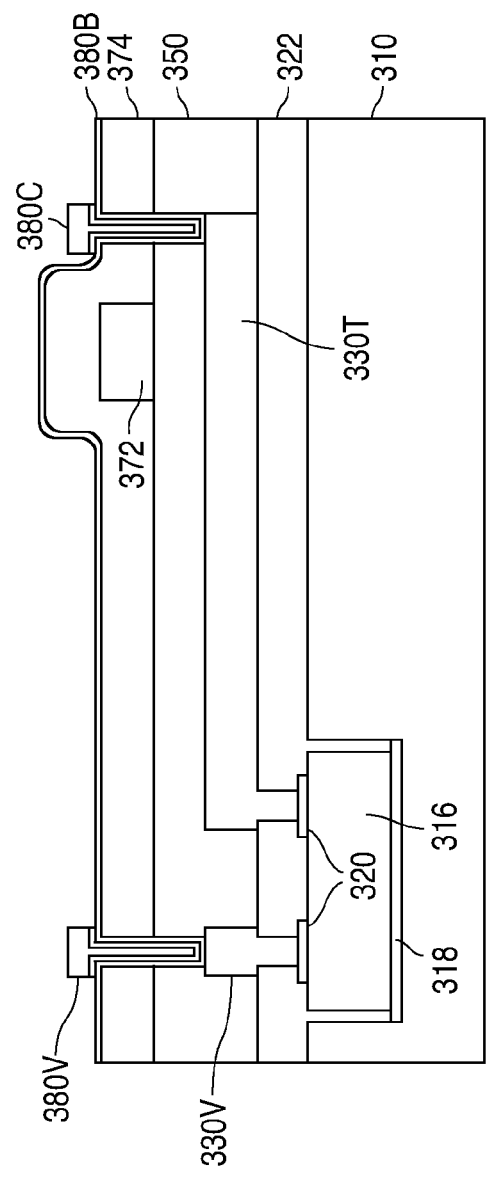

As shown in FIGS. 33A-33C, following the formation of plating mold 380M, copper is electroplated in a conventional manner to form a number of copper regions 380R approximately 10 µm thick. After the electroplating, as shown in FIGS. 34A-34C, plating mold 380M and the underlying regions of seed layer 380S and barrier layer 380B are removed to form the via structures 380V, the via structures 380G, and the upper coil structures 380C. (If non-conductive, barrier layer 380B can optionally remain as illustrated.)

Figure 35A:
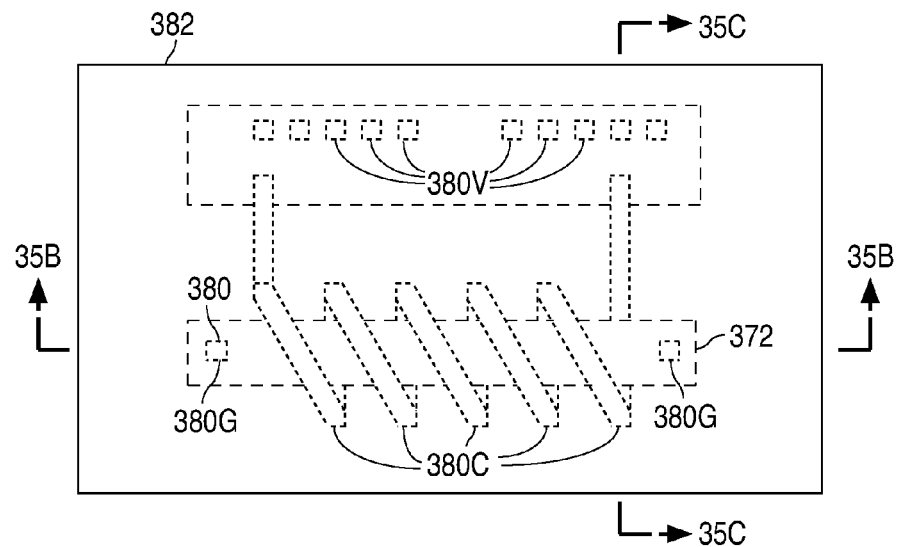
Figure 35B:
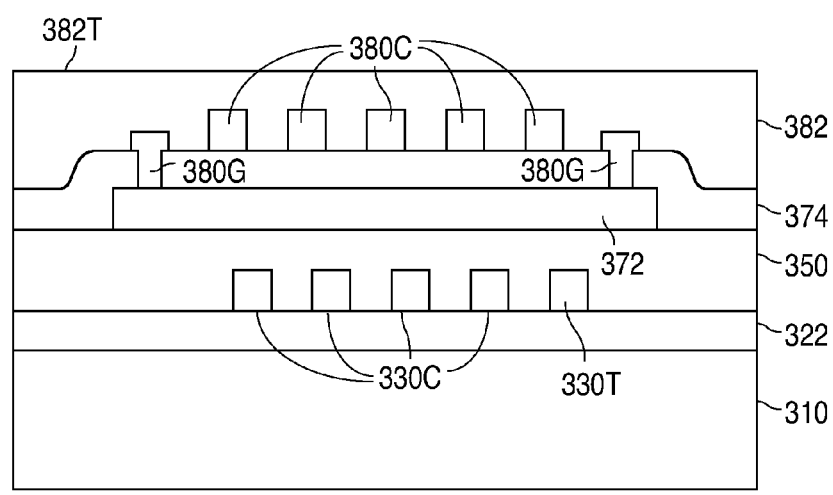
Figure 35C:
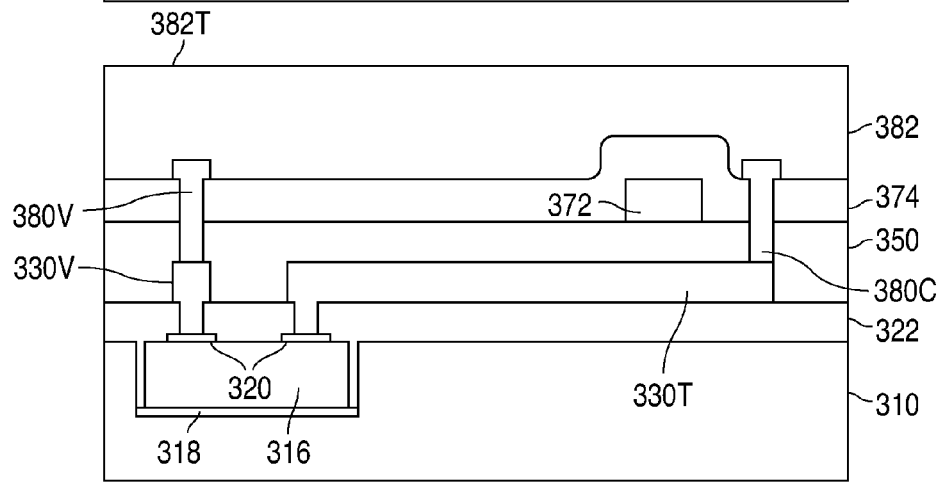

As shown in FIGS. 35A-35C, after the via structures 380V, the via structures 380G, and the upper coil structures 380C have been formed, a non-conductive structure 382 with a substantially planar top surface 382T is formed on non-conductive structure 374, the via structures 380V, the via structures 380G, and the upper coil structures 380C.

Figure 36A:
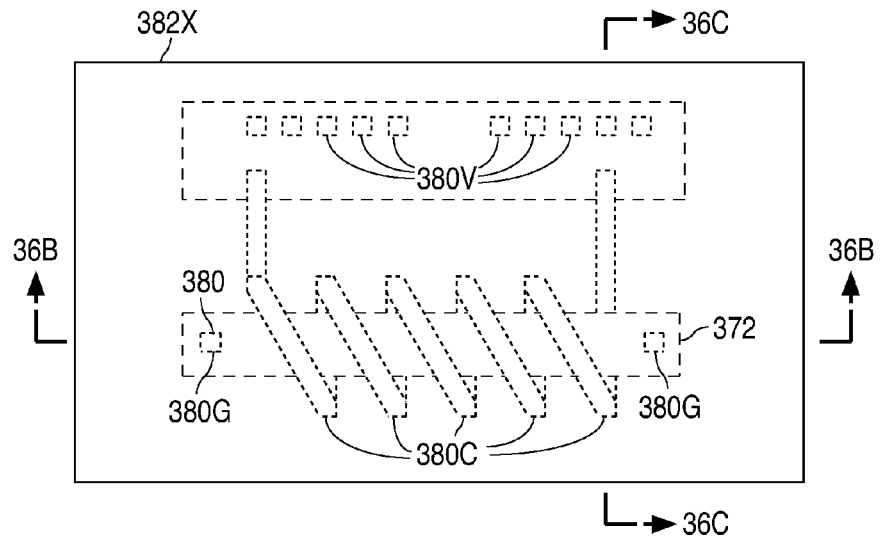
Figure 36B:
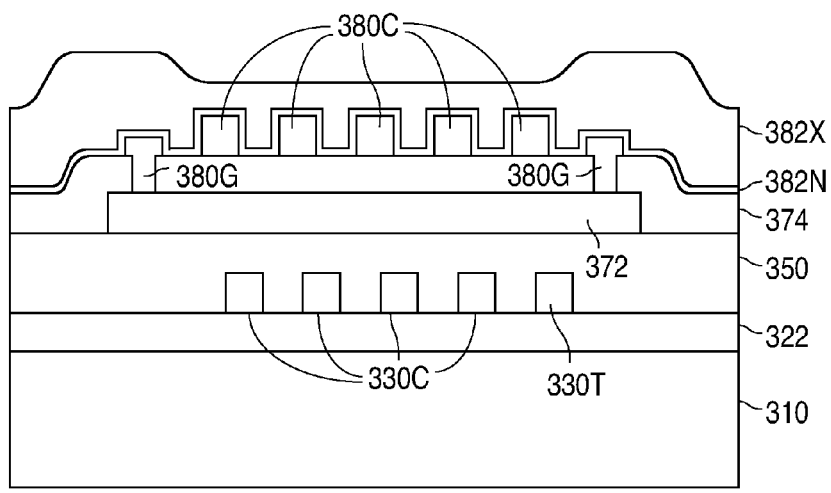
Figure 36C:
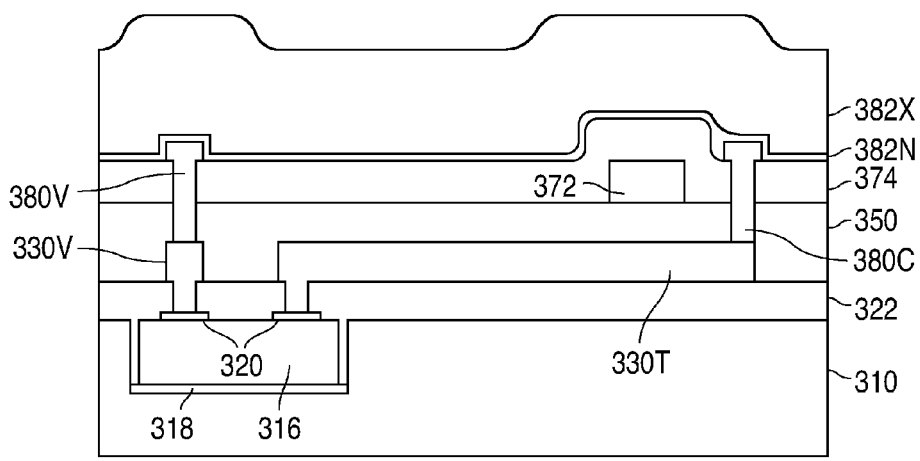

For example, as shown in FIGS. 36A-36C, non-conductive structure 382 can be formed by depositing a silicon nitride layer 382N approximately 0.6 µm thick on non-conductive structure 374 and the metal upper structures 380. After this, a layer of low temperature silicon dioxide 382X approximately 15 µm thick is conventionally formed on the top surface of silicon nitride layer 382N.

Figure 37A:
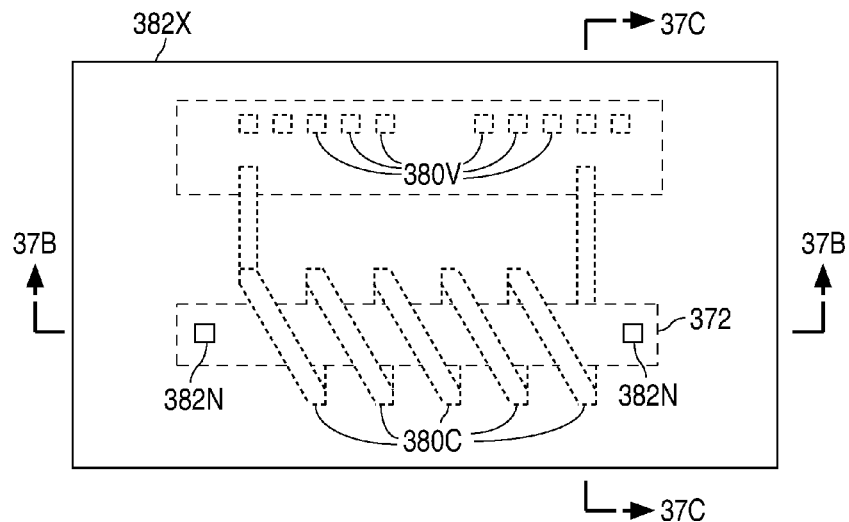
Figure 37B:
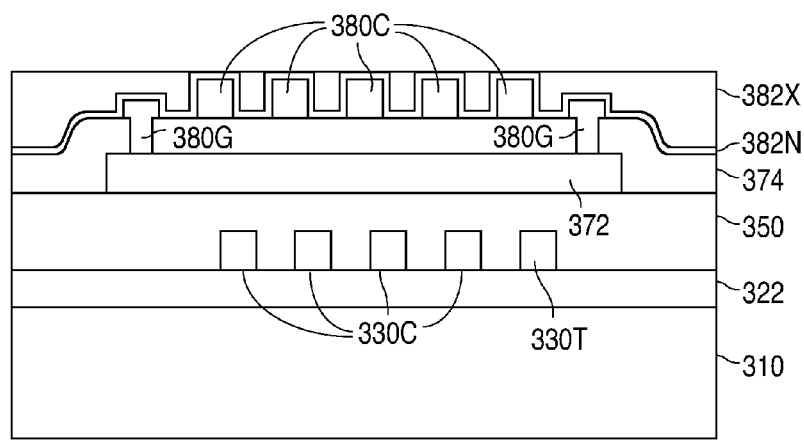
Figure 37C:
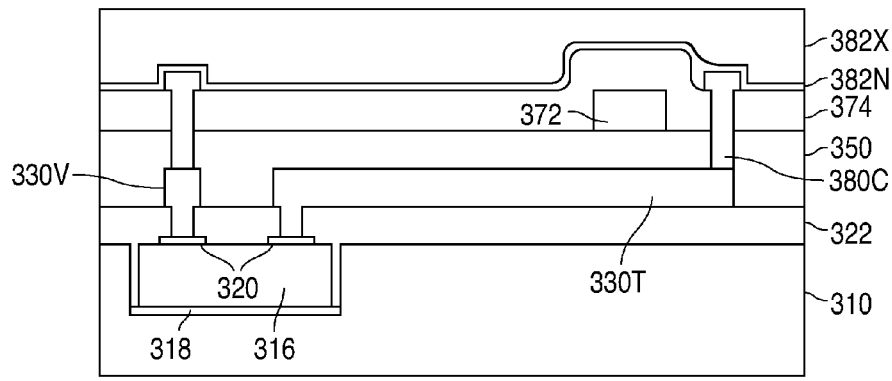
Figure 38A:
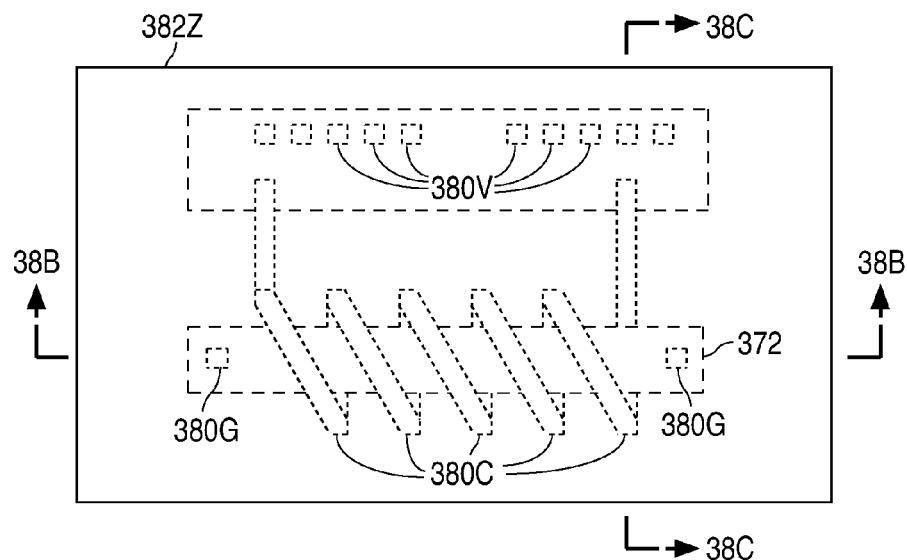
Figure 38B:
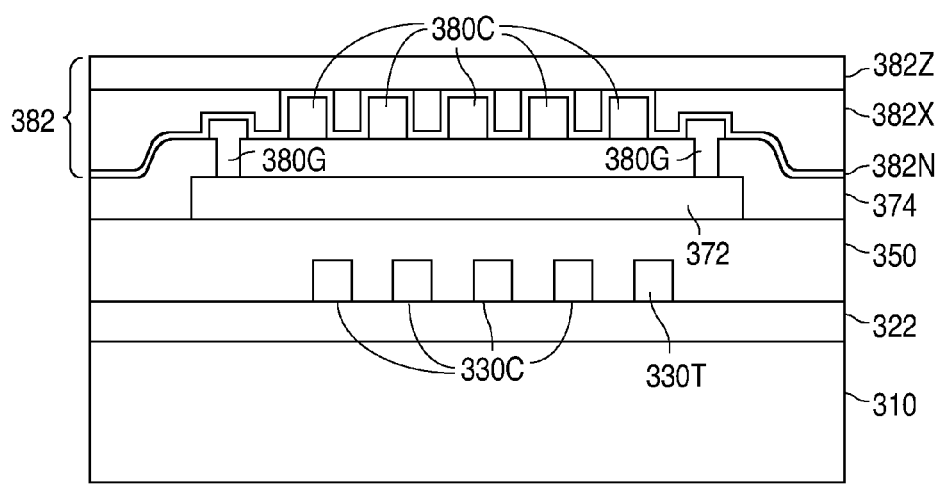
Figure 38C:
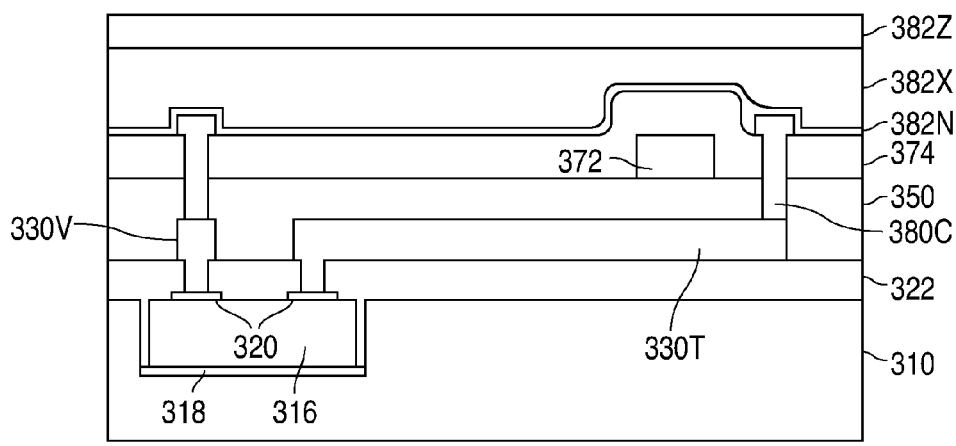

As shown in FIGS. 37A-37C, following the formation of oxide layer 382X, oxide layer 382X is planarized in a conventional manner, such as with chemical-mechanical polishing, until nitride layer 382N over the via structures 380G is exposed. As shown in FIGS. 38A-38C, after nitride layer 382N has been exposed, a silicon dioxide layer 382Z approximately 2 µm thick is deposited to form the substantially planar top surface 382T of non-conductive structure 382. Nitride layer 382N can optionally be omitted with the planarization stopping on the via structures 380G.

Figure 39A:
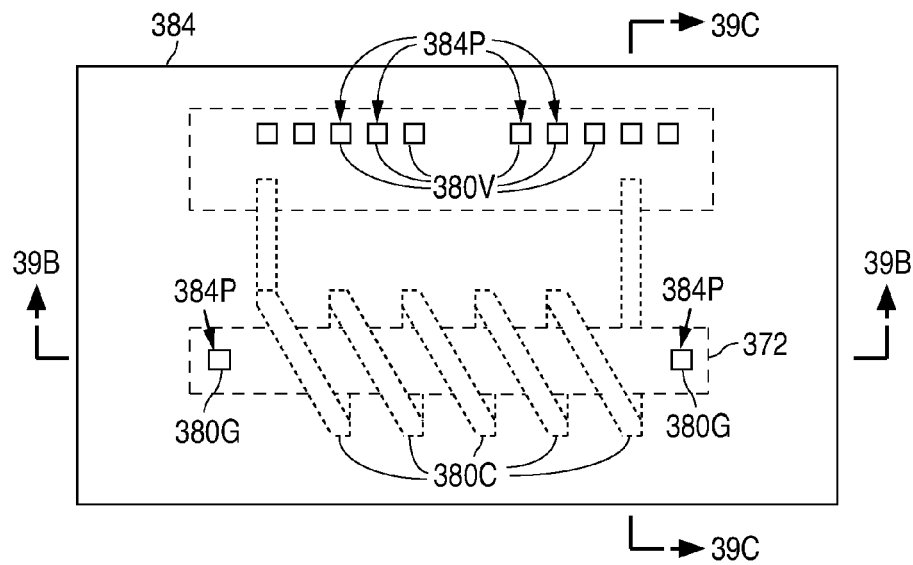
Figure 39B:
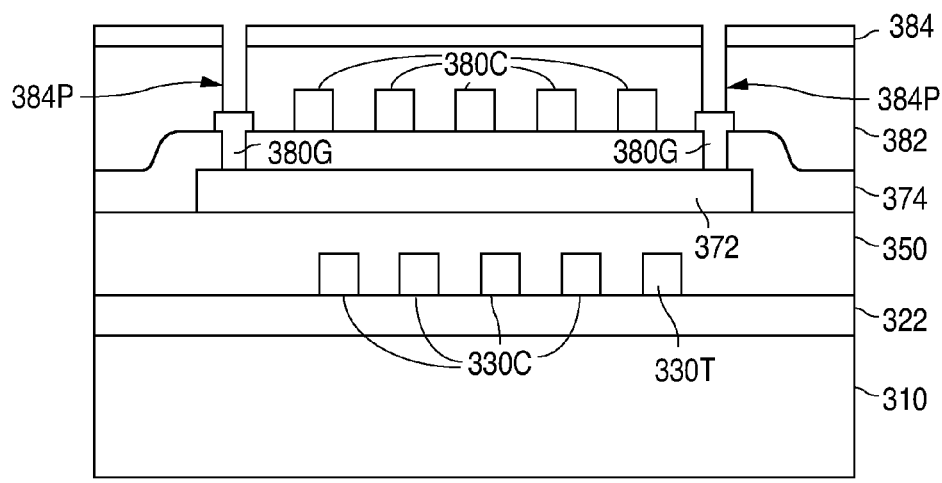
Figure 39C:
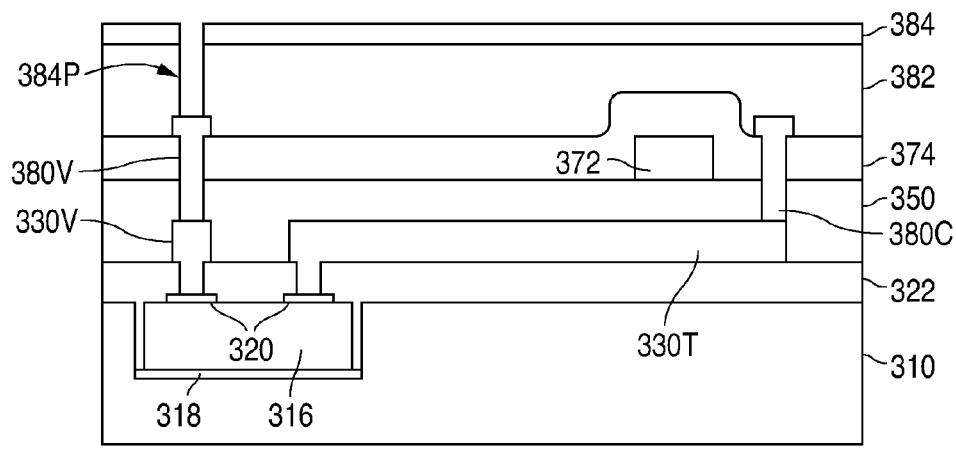

As shown in FIGS. 39A-39C, after non-conductive structure 382 has been formed, a patterned photoresist layer 384 approximately 15 µm thick is formed on the top surface of non-conductive structure layer 382 in a conventional manner. Following the formation of patterned photoresist layer 384, non-conductive structure 382 is etched (e.g., dry etched) to form a number of openings 384P that expose the via structures 380V and the via structures 380G. Patterned photoresist layer 384 is then removed in a conventional manner, such as with acetone. Once patterned photoresist layer 384 has been removed, the resulting structure is conventionally cleaned to remove organics.

Alternately, non-conductive structure 382 can be formed by depositing a layer of photoimageable epoxy or polymer, such as SU-8, benzocyclobutene (BCB), or polybenzoxazole (PBO), which is substantially self planarizing. Once the photoimageable epoxy or polymer has been deposited, the openings 384P are formed in the photoimageable epoxy or polymer layer by projecting a light through a mask to form a patterned image on the photoimageable epoxy or polymer layer that softens the regions of the photoimageable epoxy or polymer layer that are exposed by the light, and then removing the softened regions of the photoimageable epoxy or polymer layer.

Figure 40A:
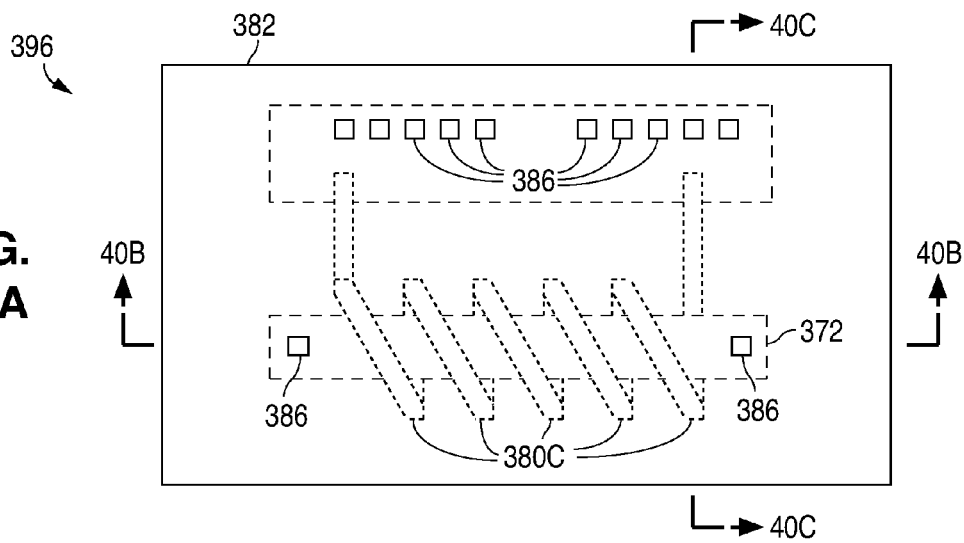
Figure 40B:
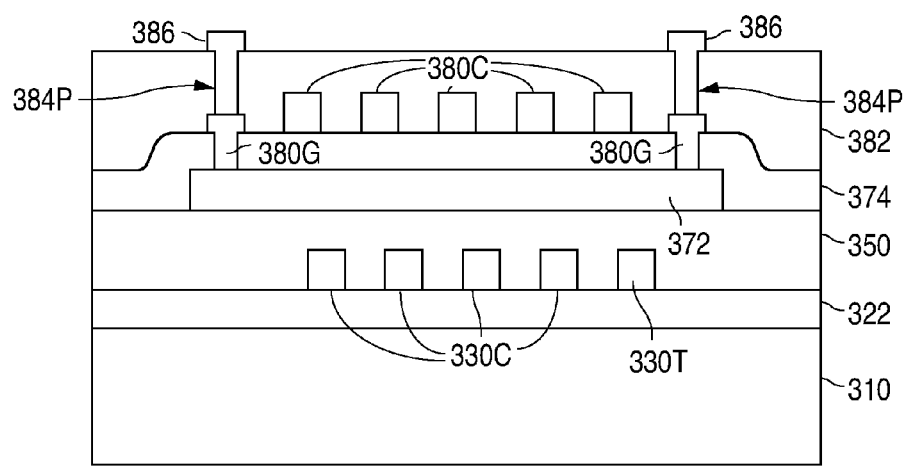
Figure 40C:
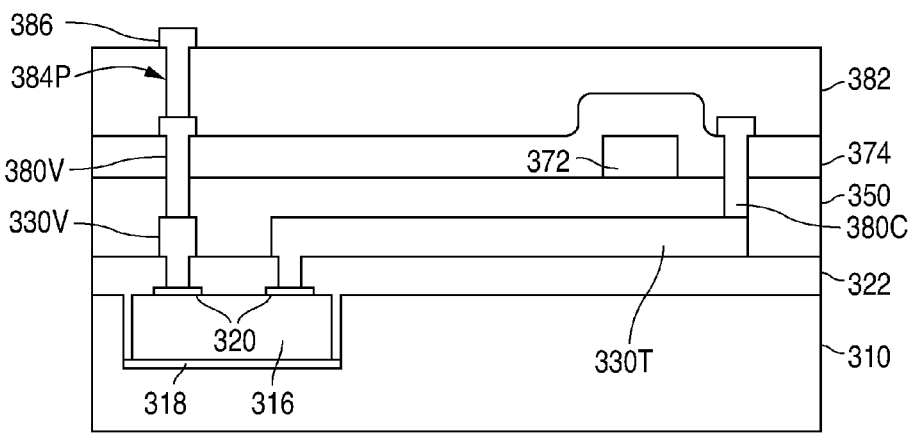
Figure 41A:
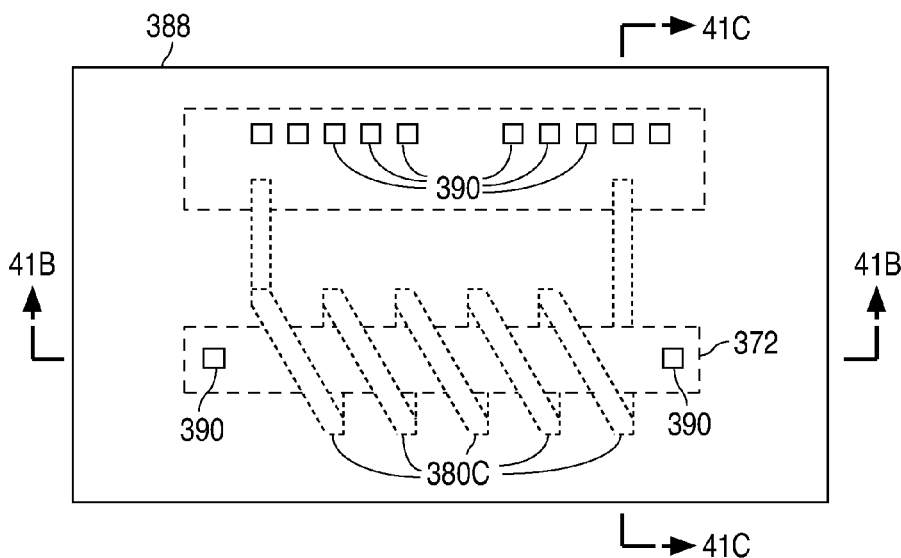
Figure 41B:
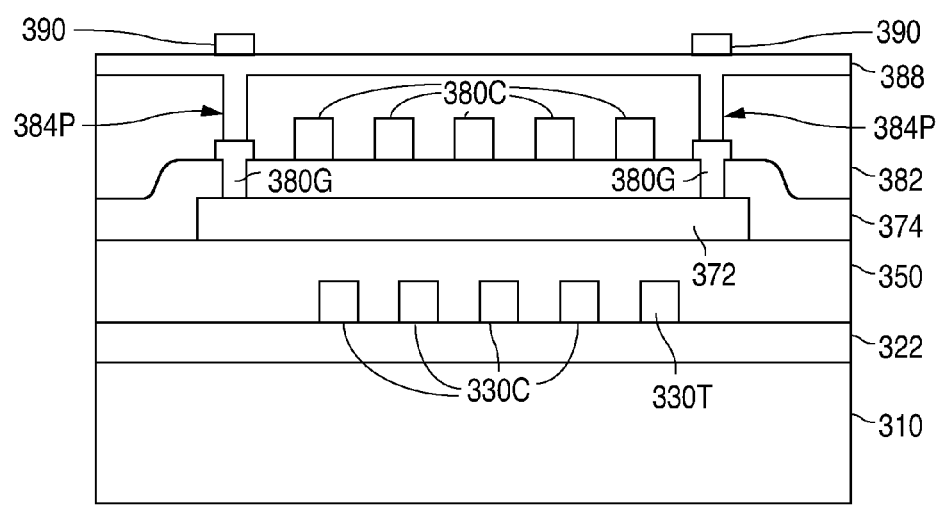
Figure 41C:
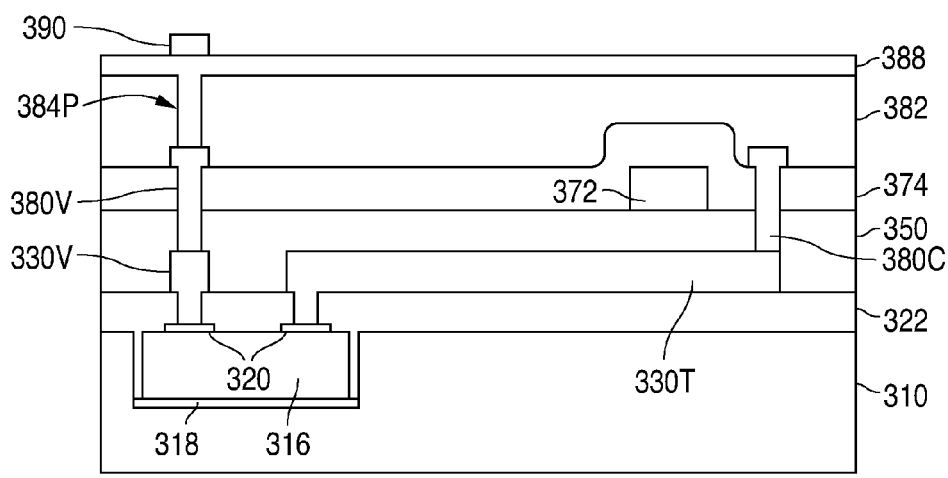

After the openings 384P have been formed, as shown in FIGS. 40A-40C, a number of metal bond pad structures 386 are formed to touch non-conductive structure 382, the via structures 380V, and the via structures 380G. For example, as shown in FIGS. 41A-41C, the metal bond pad structures 386 can be formed by sputter depositing a metal layer 388, such as 300 Å of titanium followed by 1 µm of aluminum.

Next, a patterned photoresist layer 390 approximately 15 µm thick is formed on the top surface of metal layer 388 in a conventional manner. Following the formation of patterned photoresist layer 390, metal layer 388 is etched (e.g., dry etched) to remove the exposed regions and form the metal bond pad structures 386. Patterned photoresist layer 390 is then removed in a conventional manner, such as with acetone. Once patterned photoresist layer 390 has been removed, the resulting structure is conventionally cleaned to remove organics, such as with a Piranha etch.

Figure 42A:
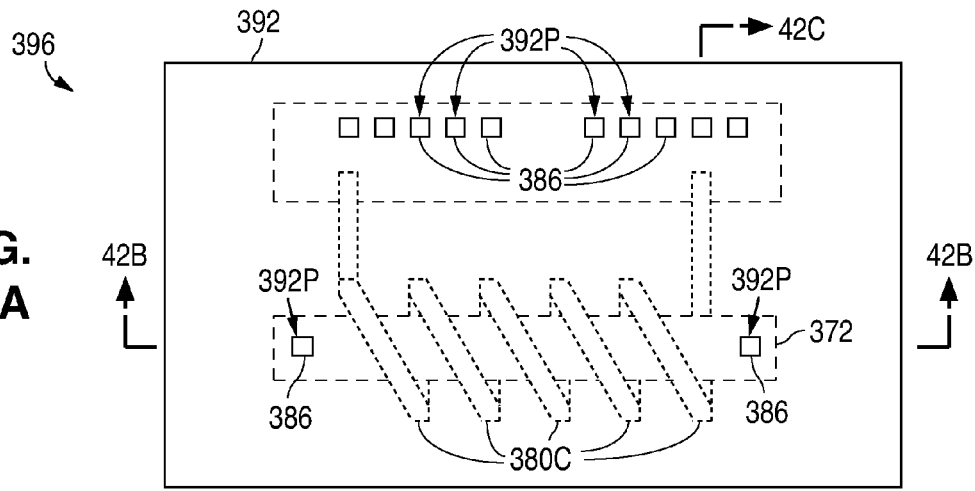
Figure 42B:
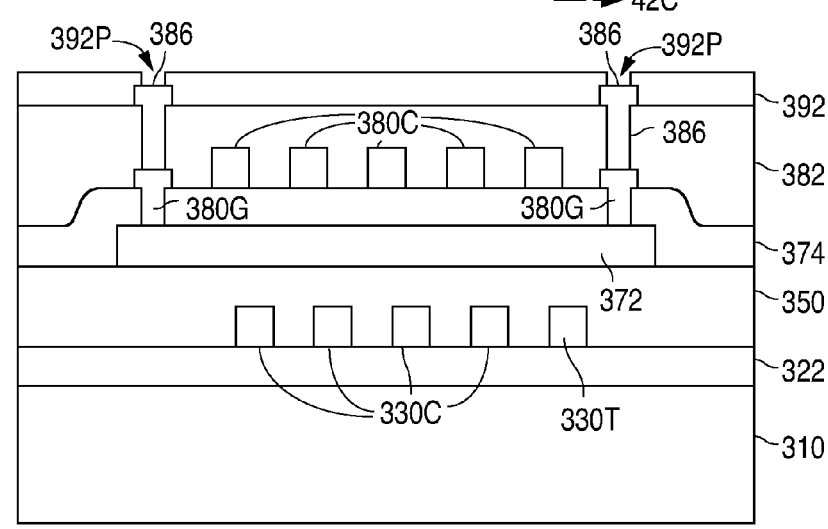
Figure 42C:
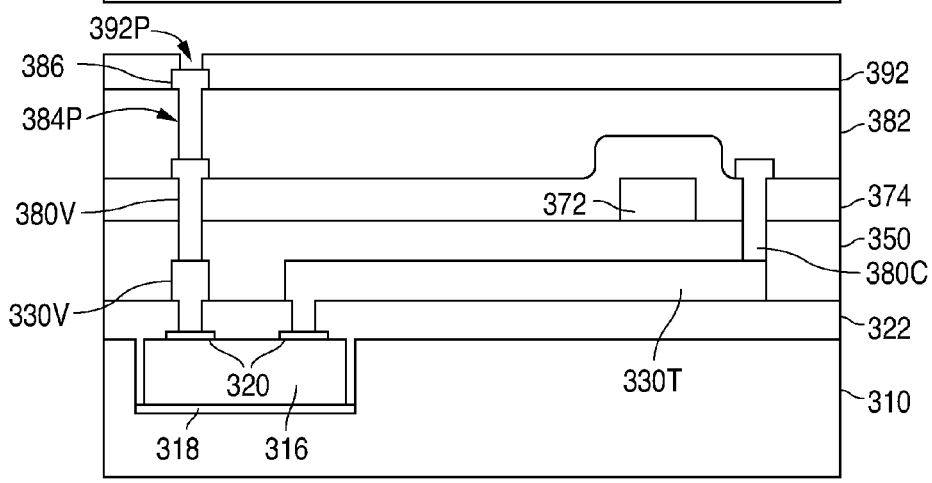

After the structure has been cleaned, as shown in FIGS. 42A-42C, a passivation structure 392 is optionally formed on the top surface of non-conductive structure 382 and the metal bond pad structures 386. As further shown in FIGS. 42A-42C, passivation structure 392 is formed to have a number of pad openings 392P that expose the metal bond pad structures 386.

Figure 43A:
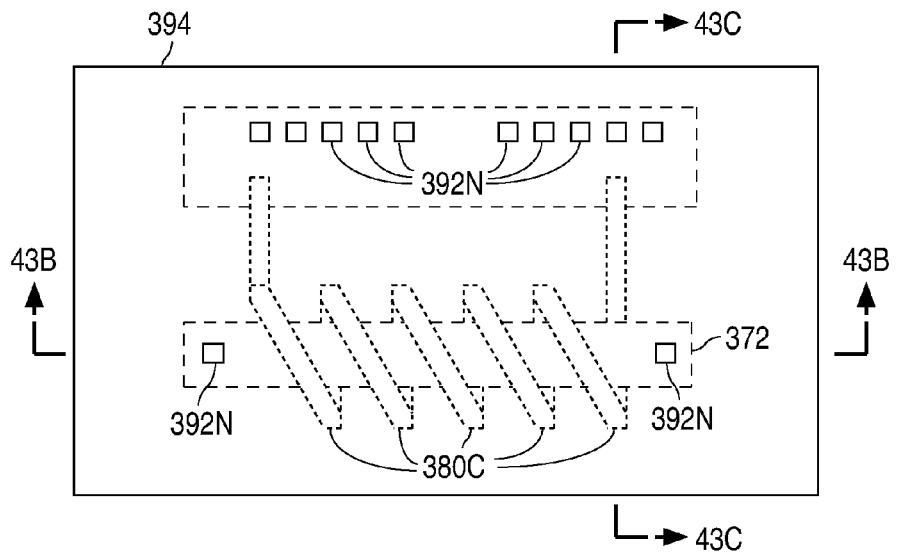
Figure 43B:
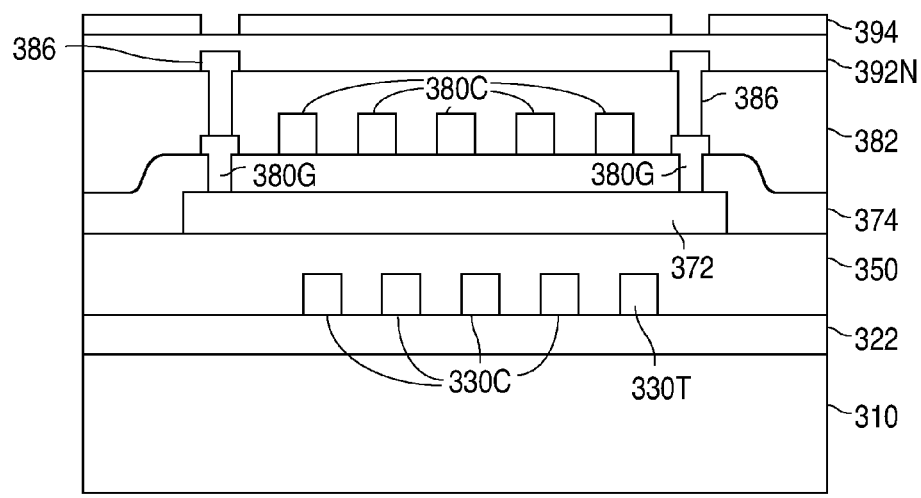
Figure 43C:
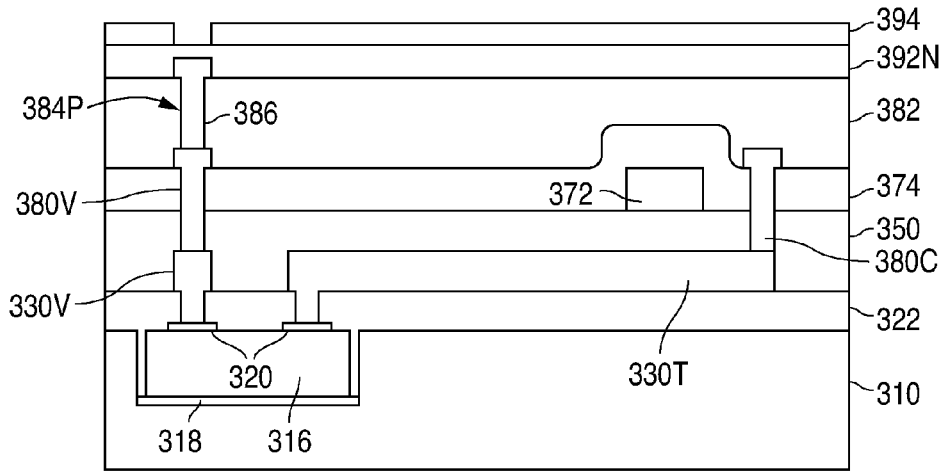

For example, as shown in FIGS. 43A-43C, passivation structure 392 can be formed by depositing a passivation layer 392N, such as a layer of oxide followed by a layer of silicon nitride, on the top surface of non-conductive structure 382. Following this, a patterned photoresist layer 394 approximately 15 µm thick is formed on the top surface of passivation layer 392N in a conventional manner.

Following the formation of patterned photoresist layer 394, the exposed regions of passivation layer 392N are etched to expose the metal bond pad structures 386. The openings in patterned photoresist layer 394 are formed to be smaller than the top surface of the metal bond pad structures 386 to provide a moisture barrier. Patterned photoresist layer 394 is then removed in a conventional manner, followed by a conventional cleaning.

Alternately, passivation structure 392 can be formed by depositing a layer of photoimageable epoxy or polymer, such as SU-8, benzocyclobutene (BCB), or polybenzoxazole (PBO), which are substantially self planarizing. Once the photoimageable epoxy or polymer has been deposited, the openings 392P are formed in the photoimageable epoxy or polymer layer by projecting a light through a mask to form a patterned image on the photoimageable epoxy or polymer layer that softens the regions of the photoimageable epoxy or polymer layer that are exposed by the light, and then removing the softened regions of the photoimageable epoxy or polymer layer.

The formation of the metal bond pad structures 386 or the formation of the optional passivation structure 392 completes the formation of a GMI magnetometer wafer 396. After GMI magnetometer wafer 396 has been formed, the back side of GMI magnetometer wafer 396 can be ground down as necessary so that the completed assembly can fit into a package. Following this, GMI magnetometer wafer 396 is diced to form a number of GMI magnetometer dice.

Thus, a semiconductor GMI magnetometer and a method of forming a semiconductor GMI magnetometer have been described. One of the advantages of the present invention is that the GMI magnetometer of the present invention is formed in a semiconductor process which, in turn, substantially reduces the size and cost of GMI magnetometers.

Another advantage is that rather than forming a single GMI sensor on each die, a large number of GMI sensors can be connected together in parallel to form a GMI magnetometer that significantly increases the sensitivity and/or reduces the width of the sensor head. In addition, by forming die 216 in semiconductor structure 210, the parasitic inductance is reduced.

In the FIGS. 2A-2C example, sense coil 281 is utilized to detect the change in impedance. Alternately, the change in impedance that results from an external magnetic field can be detected by processing the alternating current signal that passes through magnetic structure 272. Thus, in an alternate embodiment, the structure and steps to form sense coil 281 can optionally be omitted.

Figure 44A:
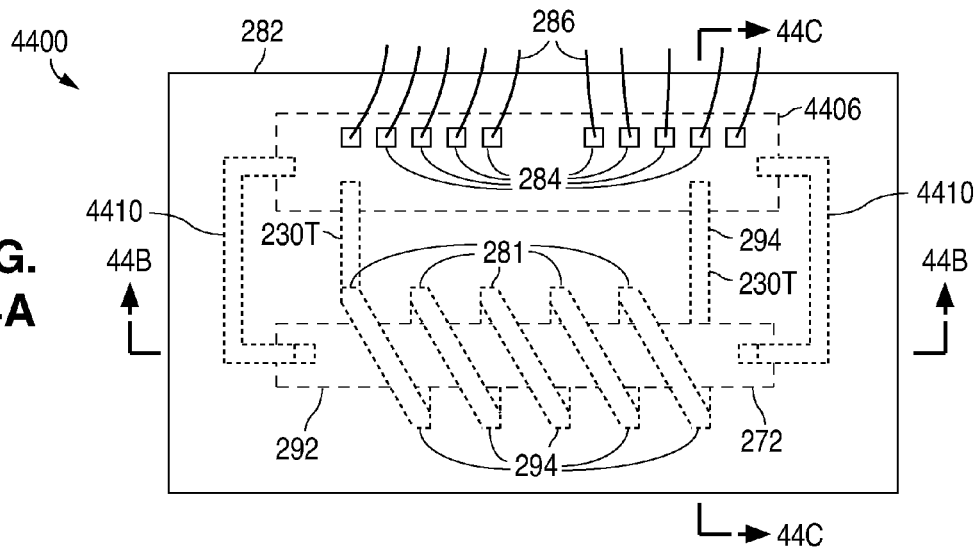
FIGS. 44A-44C are views illustrating an example of a semiconductor GMI magnetometer 4400 in accordance with an alternate embodiment of the present invention.
Figure 44B:
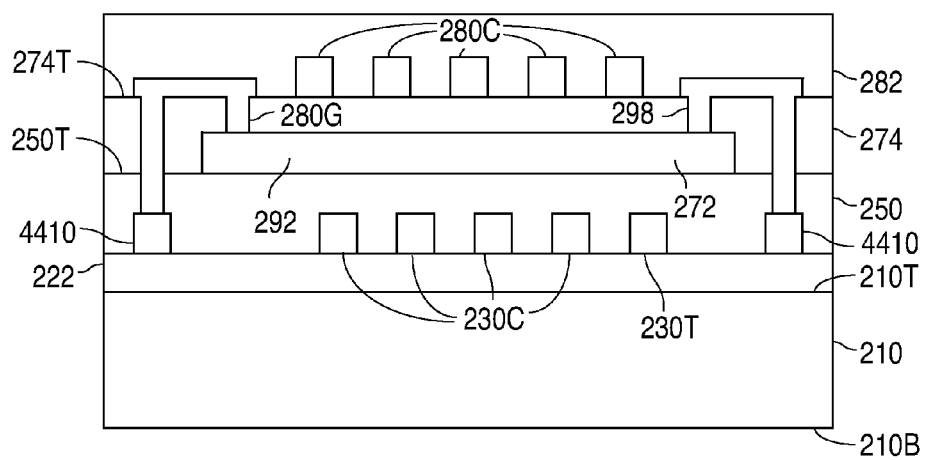
Figure 44C:
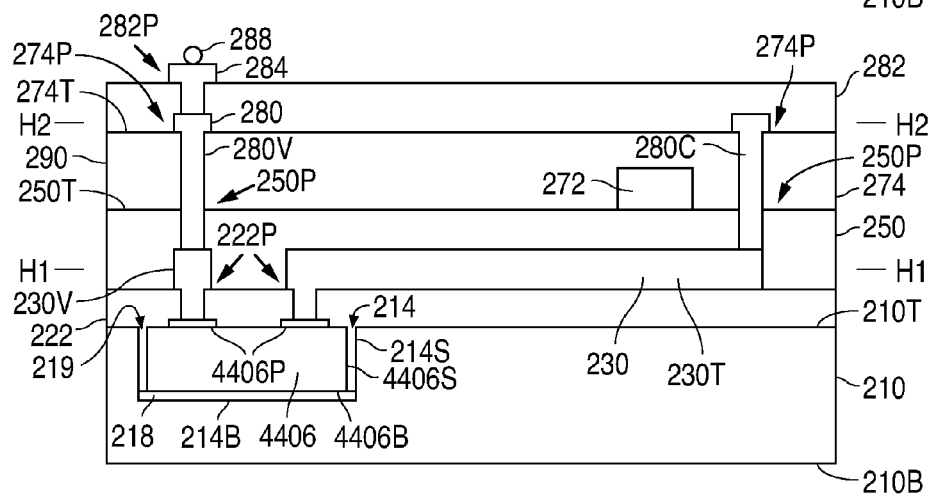

FIGS. 44A-44C show views that illustrate an example of a semiconductor GMI magnetometer 4400 in accordance with an alternate embodiment of the present invention. FIG. 44A shows a plan view, while FIG. 44B shows a cross-sectional view taken along line 44B-55B in FIG. 44A, and FIG. 44C shows a cross-sectional view taken along line 44C-44C in FIG. 44A. Semiconductor GMI magnetometer 4400 is similar to semiconductor GMI magnetometer 200 and, as a result, utilizes the same reference numerals to designate the structures which are common to both magnetometers.

As shown in FIGS. 44A-44C, semiconductor GMI magnetometer 4400 differs from semiconductor GMI magnetometer 200 in that semiconductor GMI magnetometer 4400 utilizes a die 4406 in lieu of die 216. Die 4406, which has a side wall surface 4406S, a bottom surface 4406B, and conductive pads 4406P, differs from die 216 in that die 4406 further includes a circuit that outputs a high-frequency alternating current.

Semiconductor GMI magnetometer 4400 further differs from semiconductor GMI magnetometer 200 in that semiconductor GMI magnetometer 4400 includes via trace structures 4410 that are connected to die 4406 in addition to the via trace structures 230T. The via trace structures 4410 can be formed at the same time and in the same manner as the via trace structures 330T.

As additionally shown in FIGS. 44A-44C, semiconductor GMI magnetometer 4400 differs from semiconductor GMI magnetometer 200 in that the via structures 280G of semiconductor GMI magnetometer 4400, which touch the opposing end regions of magnetic structure 272, also touch the via trace structures 4410.

Semiconductor GMI magnetometer 4400 operates the same as GMI magnetometer 200. GMI magnetometer 200 illustrates a magnetometer that utilizes an external alternating current source, while GMI magnetometer 4400 illustrates a magnetometer that utilizes an alternating current source that is internal to die 4406.

It should be understood that the above descriptions are examples of the present invention, and that various alternatives of the invention described herein may be employed in practicing the invention. For example, dummy magnetic conductors and non-magnetic conductors, which have no electrical function, can be formed at the same time that the real magnetic and non-magnetic conductors are formed to provide better planarization results. Thus, it is intended that the following claims define the scope of the invention and that structures and methods within the scope of these claims and their equivalents be covered thereby.

What is claimed is:

1. A semiconductor magnetometer comprising:
    a semiconductor structure having a bottom surface, a top surface, and a cavity that extends from the top surface down into the semiconductor structure, the cavity having a bottom surface that lies above and vertically spaced apart from the bottom surface of the semiconductor structure;
    a die adhesively attached to the bottom surface of the cavity, the die having a plurality of external electrical connection points;
    a non-conductive structure that touches the die and the top surface of the semiconductor structure;
    a magnetic conductor that touches the non-conductive structure, the magnetic conductor having a first end region and a second end region;
    a first non-magnetic conductor that touches the non-conductive structure, the first non-magnetic conductor being electrically connected to the die, and wound around the magnetic conductor in a spiral to form a coil; and
    a second non-magnetic conductor that touches the non-conductive structure, the second non-magnetic conductor being electrically connected to the first end region of the magnetic conductor.

2. The semiconductor magnetometer of claim 1 wherein the magnetic conductor has transverse anisotropy.

3. The semiconductor magnetometer of claim 1 wherein the second non-magnetic conductor is electrically isolated from the die.

4. The semiconductor magnetometer of claim 1 wherein the second non-magnetic conductor is electrically connected to the die.

5. The semiconductor magnetometer of claim 1 and further comprising a third non-magnetic conductor that touches the non-conductive structure, the third non-magnetic conductor being electrically connected to the second end region of the magnetic conductor.

6. The semiconductor magnetometer of claim 5 wherein the first end region is laterally spaced apart from the second end region.

7. The semiconductor magnetometer of claim 5 wherein the third non-magnetic conductor is electrically isolated from the die.

8. The semiconductor magnetometer of claim 5 wherein the third non-magnetic conductor is electrically connected to the die.

9. The semiconductor magnetometer of claim 5 wherein the first non-magnetic conductor has a plurality of lower coil members that touch the non-conductive structure, and lie in a horizontal plane that lies below and vertically spaced apart from the magnetic conductor.

10. The semiconductor magnetometer of claim 9 wherein the first non-magnetic conductor has a plurality of upper coil members that touch the non-conductive structure, a portion of the upper coil members lying in a horizontal plane that lies above and vertically spaced apart from the magnetic conductor.

11. The semiconductor magnetometer of claim 10 wherein the die includes a circuit connected to the second non-magnetic conductor that inputs an alternating current to the coil.

12. The semiconductor magnetometer of claim 10 wherein the magnetic conductor has a rectangular shape.

13. The semiconductor magnetometer of claim 10 wherein a side wall space lies between a side wall of the cavity and a side wall of the die, and the first non-conductive structure fills up the side wall space.

14. The semiconductor magnetometer of claim 10 wherein the die includes a processing circuit connected to the first non-magnetic conductor that detects an alternating current and alternating voltage induced in the coil.

15. A method of forming a semiconductor magnetometer comprising:
    forming a magnetic conductor that touches a non-conductive structure, the non-conductive structure touching and lying over a die, the magnetic conductor having a first end region and a second end region;
    forming a first non-magnetic conductor that touches the non-conductive structure, the first non-magnetic conductor being electrically connected to the die, and wound around the magnetic conductor in a spiral to form a coil;
    forming a second non-magnetic conductor that touches the non-conductive structure, the second non-magnetic conductor being electrically connected to the first end region of the magnetic conductor;
    attaching the die to a bottom surface of a cavity in a semiconductor structure, the die having a plurality of external electrical connection points;
    forming the non-conductive structure to touch the die and the top surface of the semiconductor structure;
    forming a third non-magnetic conductor that touches the non-conductive structure, the third non-magnetic conductor being electrically connected to the second end region of the magnetic conductor.

16. The method of claim 15 wherein the magnetic conductor has transverse anisotropy.

17. The method of claim 15 wherein the second non-magnetic conductor is electrically isolated from the die.

18. The method of claim 15 wherein the second non-magnetic conductor is electrically connected to the die.

* * * * *